United States Patent [19]

Suwanai et al.

[11] Patent Number: 5,389,558

[45] Date of Patent: Feb. 14, 1995

[54] METHOD OF MAKING A SEMICONDUCTOR MEMORY CIRCUIT DEVICE

[75] Inventors: Naokatsu Suwanai, Koganei; Hiroyuki Miyazawa; Atushi Ogishima, both of Kodaira; Masaki Nagao, Koganei; Kyoichiro Asayama, Tachikawa; Hiroyuki Uchiyama, Kodaira; Yoshiyuki Kaneko, Kokubunji, all of Japan; Takashi Yoneoka, Irving, Tex.; Kozo Watanabe, Kodaira, Japan; Kazuya Endo, Kokubunji, Japan; Hiroki Soeda, Koganei, Japan

[73] Assignee: Hitachi, Ltd., Tokyo, Japan

[21] Appl. No.: 104,014

[22] Filed: Aug. 10, 1993

Related U.S. Application Data

[62] Division of Ser. No. 799,541, Nov. 27, 1991, Pat. No. 5,237,187.

[30] Foreign Application Priority Data

Nov. 30, 1990 [JP] Japan .................. 2-329122

[51] Int. Cl.6 .......................................... H01L 21/70
[52] U.S. Cl. .......................................... 437/52; 437/44; 437/47; 437/48; 437/60
[58] Field of Search ............... 437/44, 47, 48, 52, 437/60, 919

[56] References Cited

U.S. PATENT DOCUMENTS

| | | | |
|---|---|---|---|
| 4,742,018 | 5/1988 | Kimura et al. | 357/23.6 |
| 4,882,289 | 11/1989 | Moriuchi et al. | 437/47 |
| 4,937,645 | 6/1990 | Ootsuka et al. | 357/23.6 |
| 4,951,175 | 8/1990 | Kurosawa et al. | 357/23.6 |
| 5,081,515 | 1/1992 | Murata et al. | 357/43 |
| 5,202,275 | 4/1993 | Sugiura et al. | 437/48 |

FOREIGN PATENT DOCUMENTS

| | | | |
|---|---|---|---|
| 1-80060 | 3/1989 | Japan . | |
| 0256125 | 10/1989 | Japan | 437/44 |
| 0398569 | 11/1990 | Japan | 437/919 |

OTHER PUBLICATIONS

IEDM 88, pp. 592–595.

*Primary Examiner*—Tom Thomas
*Attorney, Agent, or Firm*—Antonelli, Terry, Stout & Kraus

[57] ABSTRACT

In a semiconductor memory circuit device wherein each memory cell is constituted by a series circuit of a memory cell selecting MISFET and an information storing capacitor of a stacked structure, there are present in a first region as a memory cell array region a first MISFET having a gate electrode and source and drain regions; first and second capacity electrodes and a dielectric film extending onto a first insulating film on the gate electrode; a second insulating film positioned on the second capacity electrode; and a first wiring positioned on the second insulating film, while in a second region as a peripheral circuit region there are present a second MISFET having a gate electrode and source and drain regions; a first insulating film on the gate electrode; a third insulating film on the first insulating film; a second insulating film on the third insulating film; and a second wiring on the second insulating film.

20 Claims, 20 Drawing Sheets

METHOD OF MAKING A SEMICONDUCTOR MEMORY CIRCUIT DEVICE

This is a divisional of application Ser. No. 07/799,541, filed Nov. 27, 1991, now U.S. Pat. No. 5,237,187.

BACKGROUND OF THE INVENTION

The present invention relates to a semiconductor memory circuit device, particularly a technique effective in its application to a DRAM (Dynamic Random Access Memory).

A memory cell for holding 1 bit of information in a DRAM is constituted by a series circuit comprising a memory cell selecting MISFET and an information storing capacitor. A gate electrode in the memory cell selecting MISFET is connected to a word line extending in a row direction. One or first semiconductor region of the memory cell selecting MISFET is connected to one of complementary data lines which are formed from a first metallic wiring layer, while the other or second semiconductor region is connected to one or first electrode of the information storing capacitor. To the other second electrode of the information storing capacitor is applied a predetermined fixed potential. A word line is composed of two layers which are the gate electrode of the memory cell selecting MISFET and a second metallic wiring layer.

This type of a DRAM tends to be increased in its integration density for attaining a larger bit storage capacity and reduced in the size of each memory cell. When the memory cell size is reduced, the size of the information storing capacitor is also reduced, so that the amount of an electric charge which serves as information is also decreased. This decrease in the amount of an electric charge stored causes deterioration of the $\alpha$-ray soft error resistance. In particular, in a DRAM of 1M bits or larger capacity, the improvement of the $\alpha$-ray soft error resistance is one of important technical subjects.

Along such technical subject - - -, - - - ; there is now a tendency towards adoption of a stacked structure (STC structure) for the information storing capacitor of each memory cell in a DRAM. The information storing capacitor is constituted by laminating a lower electrode layer, a dielectric film and an upper electrode layer successively in this order on a semiconductor substrate. The lower or first electrode layer is connected to the other or second semiconductor region of the memory cell selecting MISFET and is extended up to above the gate electrode. The lower electrode layer is patterned to have a predetermined plane shape by the application of a photolithographic technique and an etching technique to a polycrystalline silicon film deposited according to a CVD method. The dielectric film is provided along upper and side faces of the lower electrode layer. The upper second electrode layer is provided on the surface of the dielectric films and it is constituted integrally with the upper electrode layer of the information storing capacitor of a stacked structure in other memory cells adjacent thereto and is used as a common plate electrode. Like the lower electrode layer, the upper electrode layer is formed using a polycrystalline silicon film.

In order to attain a higher integration density and a larger bit storage capacity in the DRAM of such a stacked structure there has been developed a technique of forming the lower electrode layer in a fin shape, or extending the lower electrode layer vertically upwards, or using the side faces surfaces of the lower electrode layers positively as a capacitance portion. Such DRAM is shown, for example, in U.S. Pat. No. 4,742,018 or IEDM 88, pages 592-595.

Summary of the Invention

According to a study made by the present inventor, it turned out that the aforementioned DRAM involved the following problems.

In the DRAM in question, since the lower electrode layer in the information storing capacitor of each memory cell extends vertically upwards, the difference in height between a memory cell array region (or area) and a peripheral circuit region (or area) is very large. Particularly, such difference in height is marked between the portion where the gate electrode of each memory cell selecting MISFET and the upper and lower electrode layers of the information storing capacitor in the memory cell array region overlap each other and the portion of source and drain regions of each MISFET in the peripheral circuit region. As to the difference in height, note is taken of the difference in height at the time of formation of the first metallic wiring layer.

In the case of such a large difference in height between the memory cell array region and the peripheral circuit region, both regions are not positioned within the depth of focus of an aligner in the exposure process, thus making it impossible to process both regions at a time.

The depth of focus of an aligner for forming a pattern of 0.5 $\mu$m or so is considered to be 1.5 $\mu$m or so. Therefore, the difference in height between the memory cell array and the peripheral circuit region must be kept to a value not larger than 0.75 $\mu$m from a predetermined reference position.

The difference in height mentioned above sometimes causes a partial etch residue in the etching process or a base layer damage due to overetching, thus leading to deterioration of the product yield.

Moreover, in the exposure process and the etching process, since the processing accuracy is different between the memory cell array region and the peripheral circuit region, there occur variations in size between both regions, thus causing decrease of the processing margin and the resultant lowering of the integration density.

Further, the difference in height in question may cause breaking of a metallic (e.g. aluminum) line which spans the memory cell array region and the peripheral circuit region, thus resulting in deterioration of the product yield or of reliability.

Objects of the present invention reside in:
(1) providing a technique capable of improving the integration density in a semiconductor memory circuit device;
(2) providing a technique capable of improving the product yield in a semiconductor memory circuit device;
(3) providing a technique capable of improving the electrical reliability in a semiconductor memory circuit device;
(4) providing a technique capable of improving the processing margin in a semiconductor memory circuit device; and (5) providing a technique capable of shortening the fabrication process in a semiconductor memory circuit device.

The above and other objects and novel features of the present invention will become more apparent from the following description and the accompanying drawings.

The following are brief summaries of typical inventions disclosed herein.

(1) In a semiconductor memory circuit device including memory cells each constituted by a series circuit of a memory cell selecting MISFET and an information storing capacitor of a stacked structure, there are present in a first region as a memory cell array region a first MISFET having a gate electrode and source and drain regions, first and second capacity electrodes and a dielectric film extending on a first insulating film above the gate electrode, a second insulating film positioned on the second capacity electrode, and a first wiring positioned on the second insulating film, while in a second region as a peripheral circuit region there are present a second MISFET having a gate electrode and source and drain regions, a first insulating film on the gate electrode, a third insulating film on the first insulating film, a second insulating film on the third insulating film, and a second wiring on the second insulating film.

(2) In a semiconductor memory circuit device having a memory cell array formed in a first region of a main surface of a semiconductor substrate and a peripheral circuitry formed in a second region thereof, the difference between the distance of a second wiring connected to a source or drain region of a MISFET positioned in the second region from the back of the semiconductor substrate and the distance of a first wiring in the same layer as the second wiring positioned in the first region from the back of the semiconductor substrate is not larger than 1.5 μm.

(3) In a semiconductor memory circuit device having a memory cell array of memory cells each comprising a first MISFET and an information storing capacitor connected in series with each other and arranged in a matrix form and also having a peripheral circuitry composed of plural second MISFETs there are performed:

(a) a step of forming a first gate electrode of a first MISFET and a second a gate electrode of a second MISFET in first and second regions on a first conductivity type semiconductor substrate;

(b) a step of forming first semiconductor regions of a second conductivity type in the first and second regions in self-alignment manner with respect to the first and second gate electrodes;

(c) a step of forming a side wall insulating film at end portions of the first and second gate electrodes;

(d) a step of forming a second semiconductor region of a second conductivity type in self-alignment manner with respect to the second gate electrode and the side wall insulating film;

(e) a step of forming a third insulating film on the first and second regions provided on the semiconductor substrate;

(f) a step of forming a first opening in the third insulating film for exposing one of the source and drain regions of the first MISFET;

(g) a step of forming a first capacity electrode of the information storing capacitor for contact with one of the source and drain regions of the first MISFET through the first opening;

(h) a step of forming a dielectric film and a second capacity electrode of the information storing capacitor on the first capacity electrode;

(i) a step of forming a second insulating film on the third insulating film in the first and second regions of the semiconductor substrate; and (j) a step of forming a wiring layer on the second insulating film in the first and second regions.

DETAILED DESCRIPTION OF THE PREFERRED EMBODIMENTS

Figure 1:
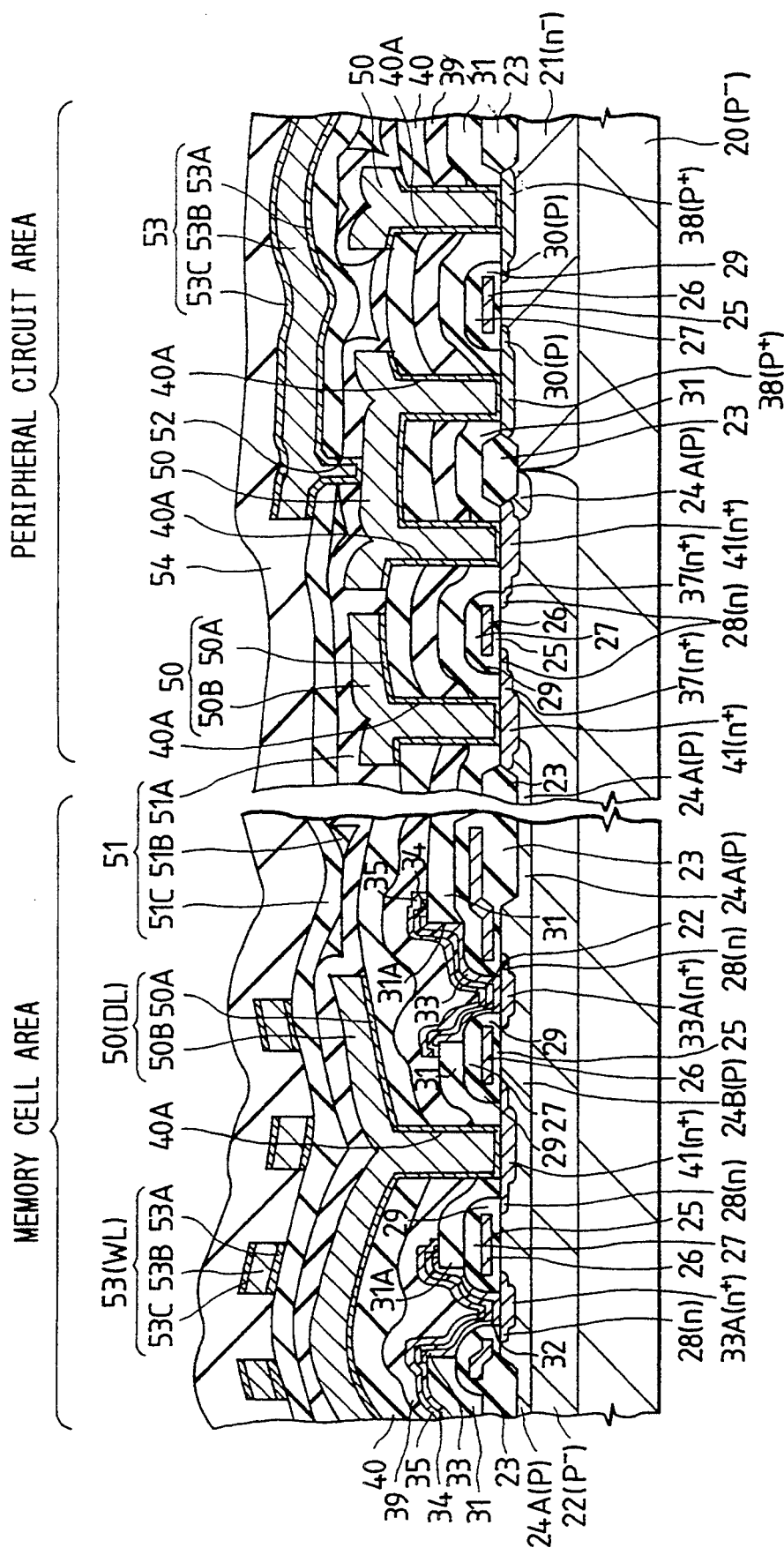
FIG. 1 is a sectional view of a principal portion of a DRAM according to an embodiment I of the present invention.

The present invention will be described below with respect to an embodiment thereof applied to a DRAM wherein each memory cell is constituted by a series circuit consisting of a memory cell selecting MISFET and an information storing capacitor of a stacked structure.

In all of the drawings for explanation of this embodiment, the portions having the same functions are indicated by the same reference numerals and repeated explanation thereof will be omitted.

Embodiment I

Figure 2:
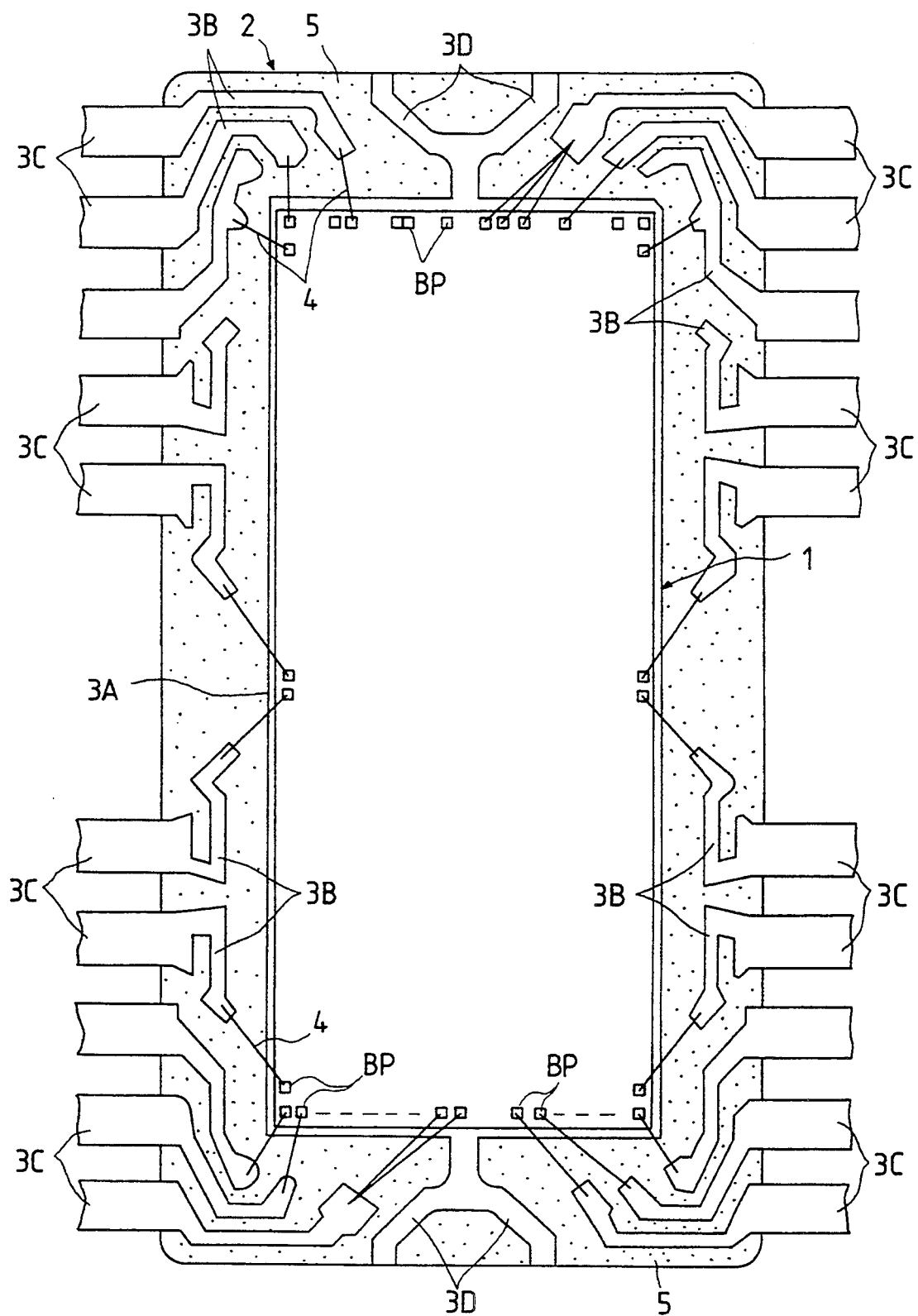
FIG. 2 is a partially sectional plan view of a resin molded type semiconductor device with the DRAM sealed therein.

FIG. 2 (a partially sectional plan view) illustrates a resin molded type semiconductor device with a DRAM according to an embodiment I of the present invention sealed therein.

As shown in the same figure, the DRAM (semiconductor pellet), indicated at 1, is sealed by a resin molded type semiconductor device 2 of an SOJ (Small Out-line J-bend) type. The DRAM 1 is mounted through an adhesive onto the surface of a tab 3A of the resin molded type semiconductor device 2.

The DRAM 1, which has a large capacity of 4M bits, is sealed in the resin molded type semiconductor device 2 of 350 mils. On a main surface of the DRAM 1 there is disposed a memory cell array comprising a plurality of memory cells arranged in a matrix form. In the other portion of the main surface of the DRAM 1 than the memory cell array there are disposed a direct peripheral circuitry and an indirect peripheral circuitry. The direct peripheral circuitry is for directly controlling information writing and reading operations for each memory cell and includes a row address decoder circuit, a column address decoder circuit and a sense amplifier circuit. The indirect peripheral circuitry is for indirectly controlling the operation of the direct peripheral circuitry and includes a clock signal generating circuit and a buffer circuit.

At the outermost peripheral portion of the DRAM 1, external terminals (bonding pads) BP are arranged centrally of the long side and the short side of the DRAM 1. The bonding pads BP are connected to inner leads 3B through bonding wires 4. As the bonding wires 4 there are used aluminum (Al) wires, or there may be used gold (Au) wires, copper (Cu) wires or coated wires obtained by coating the surfaces of metallic wires such as gold (Au) wires or copper (Cu) wires with an insulating resin. The bonding wires 4 are bonded by a bonding method which utilizes both thermal compression and ultrasonic vibration.

The inner leads 3B are formed integrally with outer leads 3C. The inner leads 3B, outer leads 3C and tab 3A are cut from a lead frame and molded. For example, the lead frame is formed using Cu or Fe—Ni (e.g. Ni content 42%) alloy. To the tab 3A are connected tab supporting leads 3D on the short sides.

The outer leads 3C are numbered and a signal to be applied to each of them is defined according to a standard. In FIG. 2, the left upper end, left lower end, right lower end and right upper end leads are No. 1, No. 10, No. 11 and No. 20 leads, respectively.

The DRAM 1, tab 3A, bonding wires 4, inner leads 3B and tab supporting leads 3D are molded by a resin molding compound 5. As the resin molding compound 5 there is used an epoxy resin with a phenolic curing agent, a silicone rubber and a filler incorporated therein for attaining the reduction of stress. The silicone rubber functions to decrease the thermal expansion coefficient of the epoxy resin. The filler, which is in the form of spherical silicon oxide grains, also functions to decrease the thermal expansion coefficient.

Figure 3:
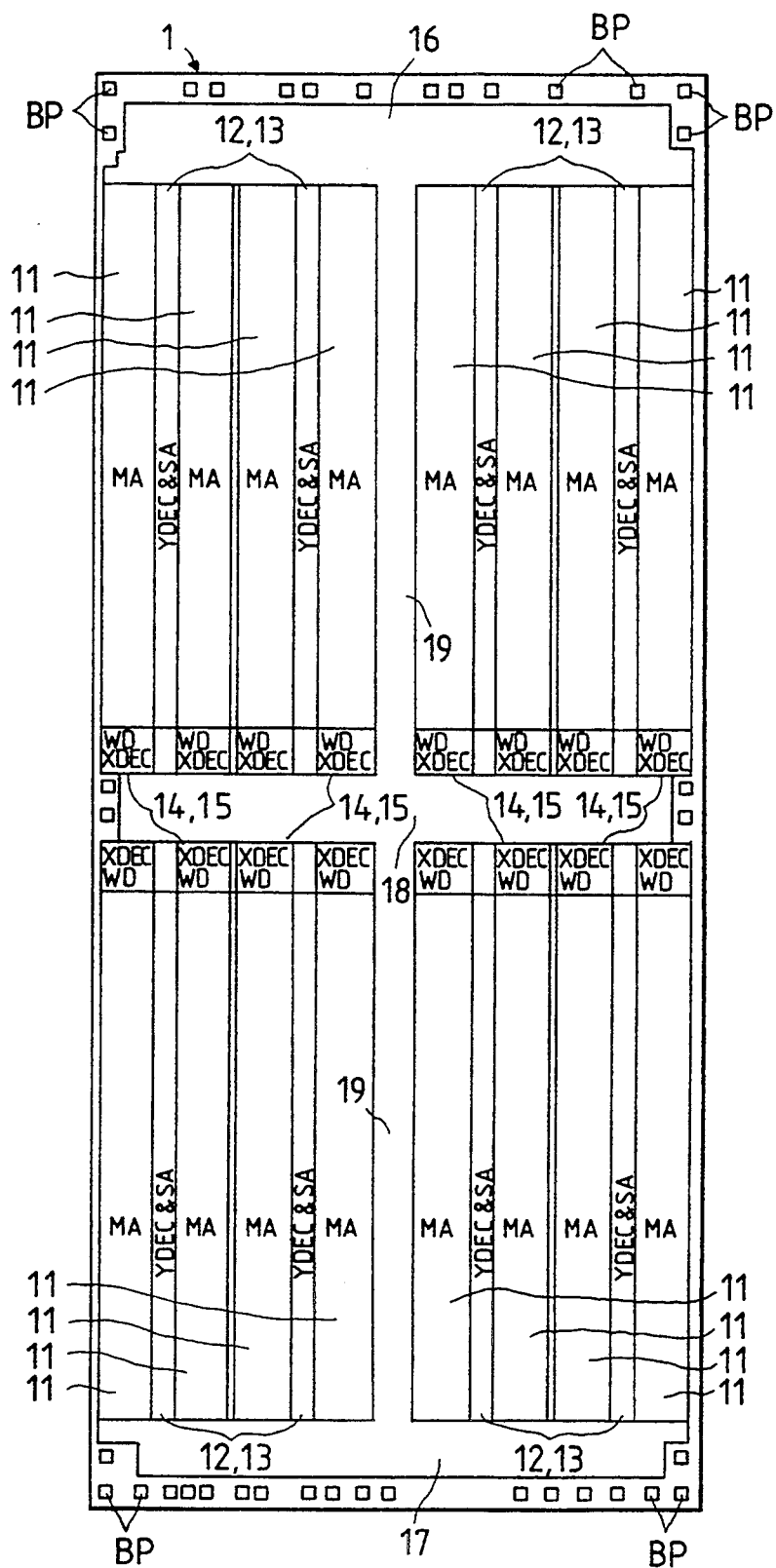
FIG. 3 is a chip layout diagram of the DRAM.

Referring now to FIG. 3 (a chip layout diagram), there is illustrated a schematic construction of the DRAM 1 which is a Semiconductor memory circuit device in the resin molded type semiconductor device 2.

As shown in FIG. 3, memory cell arrays (MA) 11 are arranged on the surface of a central portion of the DRAM 1. The DRAM 1 of this embodiment comprises a total of sixteen memory cell arrays 11 though this does not constitute any limitation. Each memory cell array 11 has a capacity of 256K bits.

Two memory arrays 11 are disposed on both sides of a column address decoder circuit (YDEC) 12 and a sense amplifier circuit (SA) 13. The sense amplifier circuit 13 is constituted by a complementary MISFET (CMOS), and a portion thereof is constituted by an n-channel MISFET. The remaining portion, i.e., p-channel MISFET, of the sense amplifier circuit 13, is disposed at an end portion of the memory cell array 11 in a position opposed to the said one portion of the sense amplifier circuit. From one end side of the sense amplifier circuit 13 there extend complementary data lines (two data lines) onto the memory cell array 11. In the DRAM 1 of this embodiment there is adopted a folded bit line method.

A row address decoder circuit (XDEC) 14 and a word driver circuit (WD) 15 are disposed at one end on the central side of each of the subdivided sixteen memory cell arrays 11.

A memory mat is constituted by a column address decoder (YDEC) 12, a sense amplifier circuit (SA) 13, two memory cell arrays 11 disposed on both sides of the YDEC 12 and the SA 13, and row address decoder circuits (XDECs) 14 and word driver circuits (WDs) 15. Thus, the DRAM 1 of this embodiment is composed of eight memory mats.

The peripheral circuits 12 to 15 which constitute such memory cell mats are called direct peripheral circuits of the DRAM 1.

On the upper side of the DRAM 1 is disposed an upper peripheral circuit 16, while on the lower side thereof is disposed a lower peripheral circuit 17. A middle peripheral circuit 18 is disposed between the four memory mats arranged on the upper side of the DRAM 1 and the four memory mats arranged on the lower side. Further, a central peripheral circuit 19 is disposed between two of the memory mats arranged on the upper side of the DRAM 1 and the other two arranged on the same side and it is also disposed between two of the memory mats arranged on the lower side and the other two arranged on the same side. These peripheral circuits 16 to 19 are constituted as indirect peripheral circuits of the DRAM 1.

Next, a principal portion of the memory mats and that of the indirect peripheral circuits in the DRAM 1 will be described below with reference to FIG. 4 (an equivalent circuit diagram of a principal portion).

Figure 4:
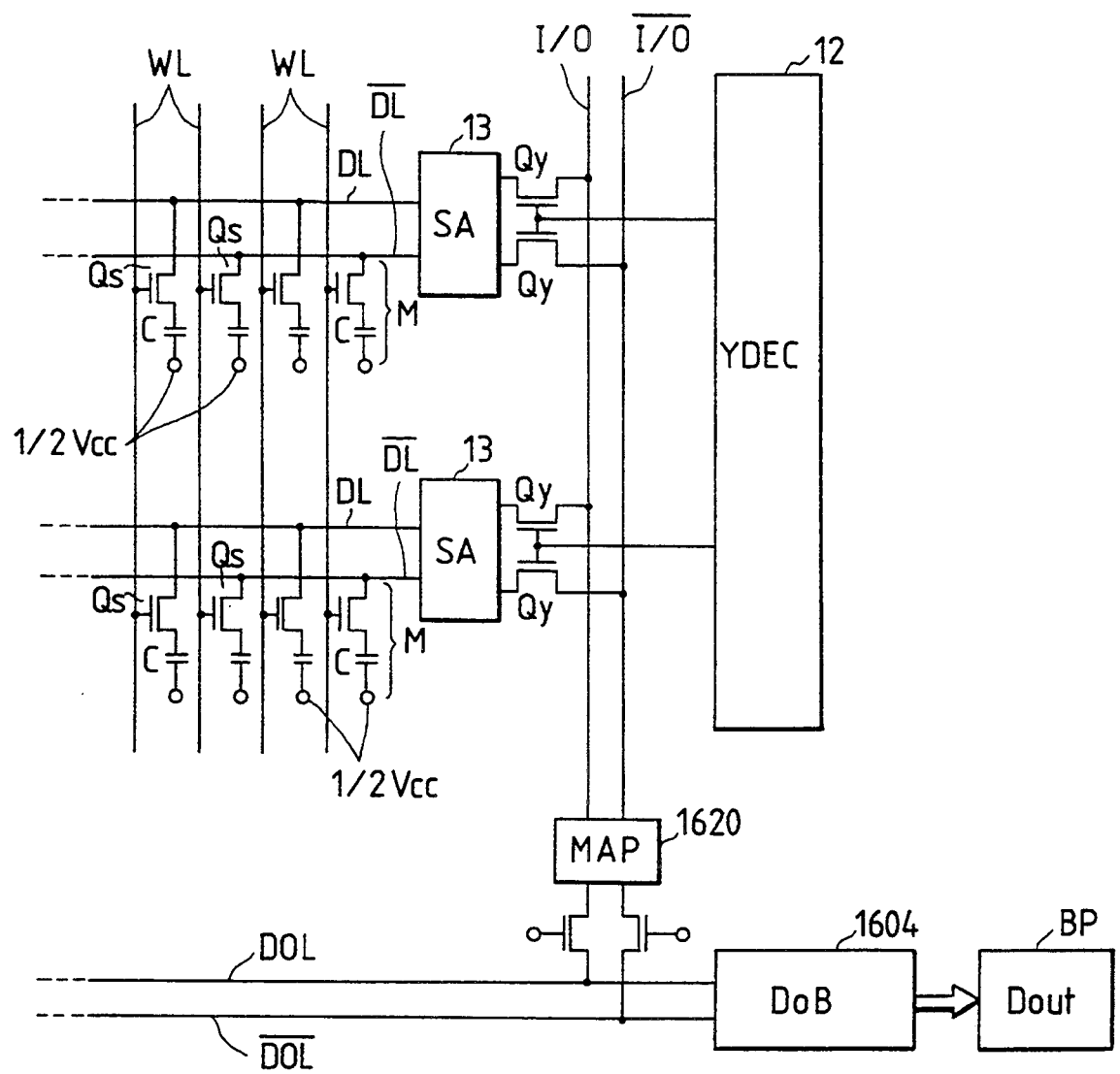
FIG. 4 is an equivalent circuit diagram of a principal portion of the DRAM.

As shown in FIG. 4, in the memory cell arrays (MAs) 11 of the DRAM 1 which adopts the folded bit line method, complementary data lines DL, $\overline{DL}$, extend in the column direction. The complementary data lines DL are arranged plural sets in the row direction and connected to the sense amplifier circuits (SAs) 13.

In the memory cell arrays 11, word lines WL extend in the row direction intersecting the complementary data lines DL. The word lines WL are arranged plurally in the column direction. Though not shown in FIG. 4, each word line WL is connected to the row address buffer circuit (XDEC) 14 and selected.

A memory cell M for storing a 1 bit of information is disposed at each of intersecting points of one of complementary data lines DL, $\overline{DL}$ and the word lines WL. The memory cell M is constituted by a series circuit of a memory cell selecting n-channel MISFET Qs and an information storing capacitor C.

One semiconductor region of the memory cell selecting MISFET Qs in the memory cell M is connected to the one of complementary data lines DL, $\overline{DL}$, while the other semiconductor region thereof is connected to one electrode of the information storing capacitor C. A gate electrode is connected to the word line WL. The other electrode of the information storing capacitor C is connected to a fixed potential $\frac{1}{2}$ Vcc. The fixed potential $\frac{1}{2}$ Vcc is an intermediate potential between the reference voltage Vss and power-supply voltage Vcc and is, say, 2.5 V or so. The fixed potential $\frac{1}{2}$ Vcc can decrease the intensity of an electric field applied to the information storing capacitor C and reduce the deterioration in dielectric strength of the dielectric film.

The sense amplifier circuit 13 is constructed so as to amplify the information of the memory cell M which is transmitted through the complementary data line DL. The information thus amplified in the sense amplifier circuit 13 is outputted to common data lines I/O, $\overline{I/O}$, through an n-channel MISFET Qy for column switch. The MISFET Qy for column switch is controlled by the column address decoder circuit (YDEC) 12.

The common data line I/O is connected to a main amplifier circuit (MAP) 1620. The main amplifier circuit 1620 is connected to an external terminal (Dout) BP for output signal through MISFET (with no symbol affixed thereto) for switch, output signal lines DOL, $\overline{DOL}$, and data output buffer circuit (DoB) 1604. The information of the memory cell M further amplified in the main amplifier circuit 1620 is outputted to the exterior of the DRAM 1 through the signal output line DOL, data output buffer circuit 1604 and bonding pad BP.

Figure 5:
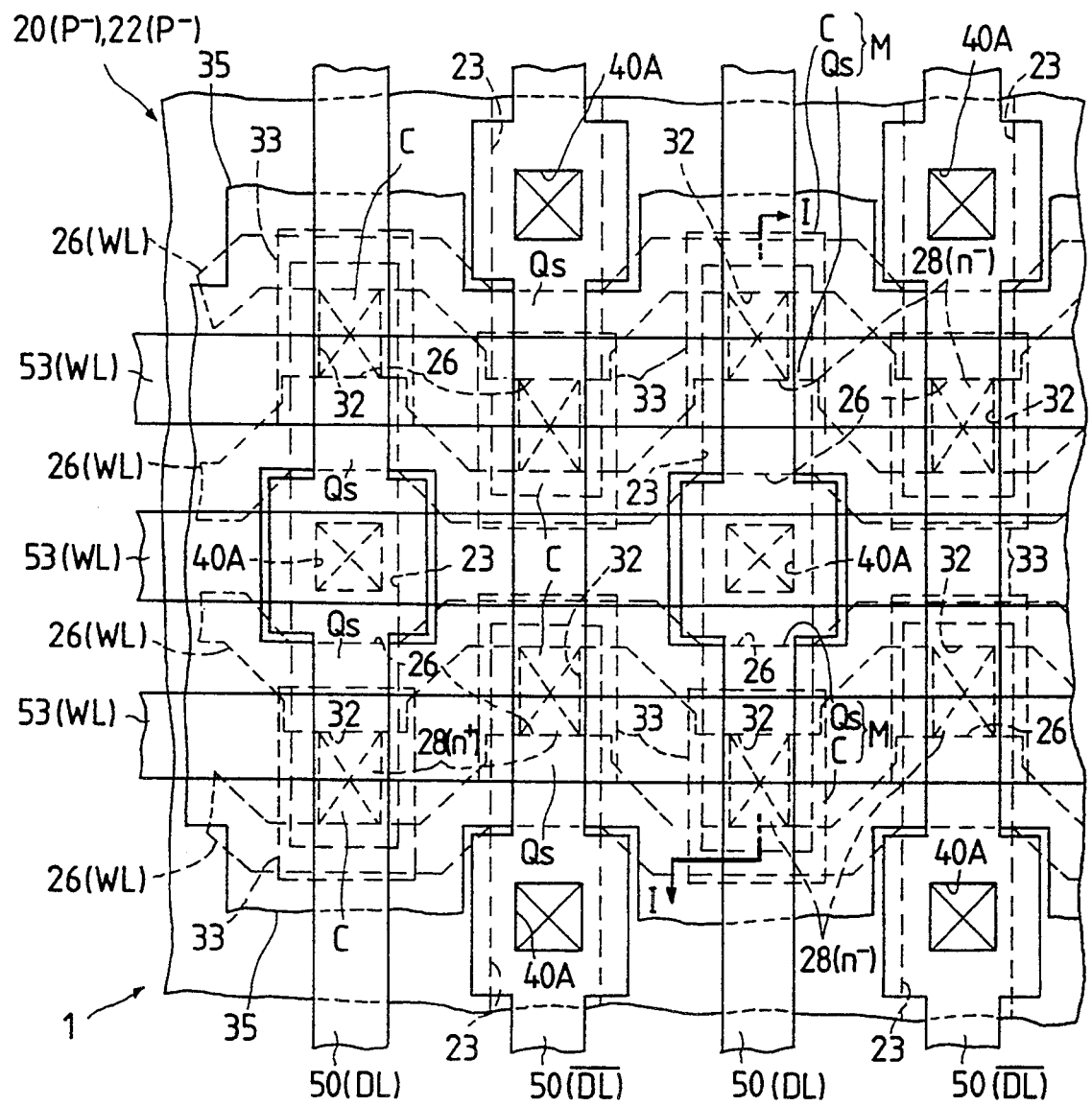
FIG. 5 is a plan view of a principal portion of the DRAM.

The following description is now provided about concrete structures of the elements which constitute each memory cell M and the peripheral circuitry (e.g. the sense amplifier circuit and the decoder circuit) in the DRAM 1. FIG. 5 (a plan view of a principal portion) shows a plane structure of each memory array 11. A sectional structure of the memory array 11 and that of the peripheral circuit elements are illustrated in FIG. 1 (a sectional view of a principal portion). The sectional structure of the memory cell M shown on the left-hand side of FIG. 1 is of the portion cut along line I—I in FIG. 5, while the right-hand side of FIG. 1 shows a sectional structure of CMOS which constitutes the peripheral circuitry.

As shown in FIGS. 1 and 5, the DRAM 1 is constituted by a $p^-$-type semiconductor substrate 20 formed of a single crystal silicon. The semiconductor substrate 20 uses (100) crystal plane as an element forming surface, which is formed at a resistance value of, say, 10 $\Omega$-cm or so.

A $p^-$-type well region 22 is provided on a main surface portion of an n-channel MISFET Qn forming region of the semiconductor substrate 20, while an $n^-$-type well region 21 is provided on a main surface portion of a p-channel MISFET Qp of the semiconductor substrate 20. Thus, the DRAM 1 of this embodiment has a twin-well structure.

On the main surface between semiconductor element forming regions of the well regions 21 and 22 there is provided an insulating film (field insulating film) 23 for element isolation. In a main surface portion of the $p^-$-type well region 22, a p-type channel stopper region 24A is provided below the insulating film 23 for element isolation. Since the surface of the $p^-$-type well region 22 is apt to undergo an n-type inversion, the channel stopper region 24A is provided in the main surface portion of at least the $p^-$-type well region.

In the memory cell forming region of the memory cell array 11, a p-type semiconductor region 24B is provided in the main surface portion of the $p^-$-type well region 22. The p-type semiconductor region 24B is provided substantially throughout the whole surface of the memory array 11. The p-type semiconductor regions 24B is formed by a lateral diffusion of a p-type impurity (B) which forms the p-type channel stopper region 24A, through the same fabrication process and using the same fabrication mask as in the formation of the p-type channel stopper region 24A. By a lateral diffusion of the p-type impurity there is formed the p-type semiconductor region 24B substantially throughout the whole surface of the memory cell M. The p-type semiconductor region 24B is formed at an impurity concentration still higher than that of the $p^-$-type well region 22 whose impurity concentration is higher than that of the $p^-$-type semiconductor substrate 20. The p-type semiconductor region 24B permits an increase of a threshold voltage of the memory cell selecting MISFET Qs and also permits an increase in the amount of an electric charge stored of the information storing capacitor C. The p-type semiconductor region 24B also functions as a potential barrier region against minority carrier created in the interior of the semiconductor substrate due to the entry of $\alpha$-ray.

The memory cell selecting MISFET Qs of the memory cell M is constituted in the main surface portion of the $p^-$-type well region 22 (actually the p-type semiconductor region 24B), as shown in FIGS. 1 and 5. The MISFET Qs is constituted within the region defined by the insulating film 23 for element isolation and the p-type channel stopper region 24A. It mainly comprises the $p^-$-type well region 22, a gate insulating film 25, a gate electrode 26 and a pair of n-type semiconductor regions 28 which are source or drain regions.

The $p^-$-type well region 22 is used as a channel forming region. The gate insulating film 25 is formed by a silicon oxide film of 15 to 20 nm thickness obtained by oxidizing the main surface of the $p^-$-type well region 22.

The gate electrode 26 is provided on the gate insulating film 25 and it is formed at a film thickness of 200 nm or so using a polycrystalline silicon film deposited by CVD for example, with an n-type impurity (P or As) being introduced therein for decreasing the resistance value. The gate electrode 26 may be constituted by a single layer of film of a refractory metal (Mo, Ti, Ta, or W) or film of a refractory metal silicide ($MoSi_2$, $TiSi_2$, $TaSi_2$, or $WSi_2$). Also, the gate electrode 26 may be constituted by a composite film obtained by laminating the said refractory metal film or refractory metal silicide film onto a polycrystalline silicon film.

As shown in FIG. 5, the gate electrode 26 is formed integrally with a word line (WL) extending in the row direction. That is, the gate electrode 26 and the word line 26 are formed by the same conductive layer. The word line 26 is formed for connection with the gate electrode 26 in each of the memory cell selecting MISFETs Qs of plural memory cells M arranged in the row direction.

The gate length of the gate electrode 26 in each memory cell selecting MISFET Qs is larger than the width of the word line 26, as shown in FIG. 5. For example, the gate length of the gate electrode 26 is 1.0 $\mu$m, while the width of the word line is 0.6 $\mu$m.

The n-type semiconductor region 28 is lower in impurity concentration than an $n^+$-type semiconductor region 37 of the MISFET Qn which constitutes the peripheral circuitry. More particularly, the n-type semiconductor region 28 is formed by an ion implantation method using phosphorus of a low impurity concentration lower than $1 \times 10^{14}$ atoms/cm$^2$.

The source and drain regions of the memory cell selecting MISFET Qs are constituted by n-type semiconductor regions 28 and $n^+$-type semiconductor regions 33A and 41 which will be described later. Thus, the $n^+$-type semiconductor regions 37 formed by an ion implanted layer of As in the source and drain regions of the MISFET which constitutes the peripheral circuitry is not present in the source and drain regions of the memory cell selecting MISFET Qs. This is for diminishing the occurrence of crystal defects caused by the introduction of high impurity ions and fully remedying crystal defects by heat treatment after the introduction of impurity. Since the amount of leakage current in the pn junction between the n-type semiconductor regions 28 and the $p^-$-type well region 22 is small, the n-type semiconductor regions 28 can stably hold the electric charge stored as information in the information storing capacitor C.

The n-type semiconductor regions 28 are formed by self-alignment with respect to the gate electrode 26 and the channel forming region side thereof is formed at a low impurity concentration, so a memory cell selecting MISFET Qs of an LDD (Lightly Doped Drain) structure is constituted thereby.

One n-type semiconductor region 28 (the complementary data line connection side) of the said memory cell selecting MISFET Qs is constituted integrally with the n+-type semiconductor region 41, while the other n-type semiconductor region 28 (the information storing capacitor C connection side) is constituted integrally with the n+-type semiconductor region 33A. The n+-type semiconductor region 41 is formed in the region defined by a connection hole 40A which is for connection between a complementary data line 50 and one n-type semiconductor region 28. The n+-type semiconductor region 41 is constituted to prevent the short-circuit between the complementary data line (50) and the p−-type well region 22. The n+-type semiconductor region 33A is formed in the region defined by a connection hole 32 which is for connection between a lower electrode layer 33 of the information storing capacitor C of a stacked structure which will be described later and the other n-type semiconductor region 28. The n+-type semiconductor region 33A is formed by diffusing an n-type impurity introduced into the lower electrode layer 33.

An insulating film 27 is formed on the gate electrode 26 of the memory cell selecting MISFET Qs, and a side wall spacer 29 is provided on the side walls of the gate electrode 26 and the insulating film 27. The insulating film 27, having a thickness of about 200 nm, is formed mainly for electrical separation between the gate electrode 26 and the electrodes (especially 33) of the information storing capacitor C formed thereon. The side wall spacer 29 mainly constitutes a memory selecting MISFET Qs of an LDD structure. The insulating film 27 and the side wall spacer 29 are each formed by a silicon oxide film deposited by CVD using inorganic silane gas and nitrogen oxide gas as a source gases.

The side wall spacer 29 is formed on the side walls of the gate electrode 26 and the insulating film 27 by the application of RIE (Reactive Ion Etching) after the deposition of silicon oxide film.

The information storing capacitor C of the memory cell M is formed by laminating a lower electrode layer 33, a dielectric film 34 and an upper electrode layer 35 successively in this order, as shown in FIGS. 1 and 5. It is of a so-called stacked structure (STC).

A portion (central portion) of the lower electrode 33 of the information storing capacitor C of a stacked structure is connected to the other n-type semiconductor region 28 of the memory cell selecting MISFET Qs. This connection is performed through a connection hole 31A formed in an interlayer insulating film 31 and the connection hole 32 defined by the side wall spacer 29. The opening size in the column direction of the connection hole 32 is defined by the spacing of the gate electrodes 26 in memory cell selecting MISFETs Qs and adjacent word lines 26. The difference between the opening size of the connection hole 31A and that of the connection hole 32 is at least larger than the size corresponding to a mask alignment margin in the fabrication process. An end portion (peripheral portion) of the lower electrode layer 33 is extended up to above the gate electrode 26 and the word line 26.

The interlayer insulating film 31 is formed at a thickness of 500 nm or so by the same insulating film as the underlying insulating film 27 and side wall spacer 29. That is, it is formed by silicon oxide film deposited by CVD using inorganic silane gas and nitrogen oxide gas as source gases.

The lower electrode layer 33 is formed by a polycrystalline silicon film deposited by CVD for example. Into this polycrystalline silicon film is introduced at a high concentration an n-type impurity (As or P) which reduces the resistance value. The lower electrode layer 33 utilizes the stepped shape of the base and the side walls of the connection hole 31A of the interlayer insulating film 31 to increase the amount of the electric charge stored in the information storing capacitor C of a stacked structure. It has a thickness of about 100 nm.

Thus, by forming the interlayer insulating film 31 thick and forming the lower electrode layer 33 along the side walls of the connection hole 31A it is made possible to increase the amount of the electric charge stored while keeping a plane area of the information storing capacitor C (the side of the lower electrode layer 33 as viewed from above) small.

In the information storing capacitor C of such a structure, an increase in thickness of the interlayer insulating film 31 leads to an increase of the value of capacitance, but the difference in height between the memory cell array region and the peripheral circuitry region becomes larger.

In the peripheral circuit region, the interlayer insulating film 31 is not removed and is allowed to remain. This is a feature of the present invention. By so doing it is made possible to reduce the difference in height between the memory cell array region and the peripheral circuit region.

In the information storing capacitor C which utilizes the side wall of the interlayer insulating film 31 as described above, it is possible to reduce the thickness of the upper and lower electrode layers 35, 33 in comparison with a DRAM of the type wherein a lower electrode layer is made thick and the side wall thereof is utilized. Therefore, even in a structure wherein the upper and lower electrode layers 35, 33 protrude from the connection hole 31A of the interlayer insulating film 31 onto the same film, it is possible to reduce the difference in height between the memory cell array region and the peripheral circuit region.

The dielectric film 34 is formed by laminating of a silicon nitride film and a silicon oxide film having a thickness of 1 to 6 nm, the silicon nitride film being deposited at a thickness of 5 to 10 nm onto the lower electrode layer 33 by CVD, and the silicon oxide film being obtained by oxidizing the silicon nitride film at a high pressure of 1.5 to 10 atm. The silicon oxide film may be obtained by oxidizing the silicon nitride film at atmospheric pressure. The dielectric film 34 is not limited to such a laminate of the silicon nitride film and the silicon oxide film. For example, it may be a tantalum oxide film of a high dielectric constant.

The upper electrode layer 35 is formed over the lower electrode layer 33 through the dielectric film 34. It is formed integrally with the upper electrode layer 35 of the information storing capacitor 35 in the adjacent memory cells M. A predetermined fixed potential ½ Vcc is applied to the upper electrode layer 35. The upper electrode layer 35, having a thickness of 100 nm, is formed by a polycrystalline silicon film deposited by CVD. Into this polycrystalline silicon film is introduced an n-type impurity (P or As) for reducing the resistance value.

As shown in FIGS. 1 and 5, one of complementary data lines (DL, $\overline{DL}$) 50 is connected to one n-type semiconductor region 28 of the memory cell selecting MISFET Qs in the memory cell M through the connection hole 40A formed in the interlayer insulating films 39 and 40. The connection between the complementary data line 50 and the n-type semiconductor region 28 is done through the n+-type semiconductor region 41.

The interlayer insulating film 39 is formed by a silicon oxide film of about 200 nm thickness deposited by CVD for example. The interlayer insulating film 40 is formed by a silicon oxide film (BPSG) of about 500 nm thickness containing phosphorus and boron and capable of being flattened by reflow. The interlayer insulating film 39 is provided for the purpose of ensuring dielectric strength and preventing the leakage of B and P contained in the overlying interlayer insulating film 40 to a constituent element (e.g. gate insulating film 25).

The complementary data line 50 is a laminate of a titanium nitride film 50A and a tungsten film 50B, of which the underlying titanium nitride film 50A is for preventing the reaction of the tungsten film 50B with silicon in the n-type semiconductor region 28. The thickness of the titanium nitride film 50A is 100 nm and that of the tungsten film is 500 nm.

In place of the combination of the titanium nitride film 50A and the tungsten film 50B there may be used a laminate of a polysilicon film or aluminum film 50A and a tungsten film 50B.

The complementary data line 50 is formed by a first metallic wiring layer.

Above the complementary data line 50 there extends a word line (WL) 53 for shunt in the row direction through an interlayer insulating film 51. The word line 53 for shunt is formed by a second metallic wiring layer and is connected electrically to the word line 26 integral with the gate electrode 26 of the memory cell selecting MISFET in a predetermined region. The word line 53 permits reducing the resistance value of the word line 26 and attaining high-speed information writing and reading operations.

The second metallic wiring layer is a laminate of three layers which are a 100 nm thick titanium-tungsten film 53A, a 500 nm thick aluminum film 53B and a 100 nm thick titanium-tungsten film 53C. The titanium-tungsten film 53A as a lower layer is for improving the electromigration resistance and also for preventing the reaction of the tungsten film 50B and the aluminum film 53B. The aluminum film 53B is an alloy film consisting of aluminum as the main component, silicon and copper. The titanium-tungsten film 53C as an upper layer is provided for lowering the reflectivity of the second metallic wiring layer and thereby diminishing the diffraction phenomenon in the exposure process.

The interlayer insulating film 51 is a composite film formed by laminating a silicon oxide film (a deposited insulating film) 51A, a silicon oxide film (an applied insulating film) 51B and a silicon oxide film (a deposited insulating film) 51C successively in this order.

The silicon oxide films 51A and 51C as lower and upper layers, respectively, of the interlayer insulating film 51 are each formed by deposition according to a plasma CVD method. The silicon oxide film 51B as a middle layer is formed by application according to an SOG (Spin On Glass) method followed by baking. The middle silicon oxide film 51B is formed for the purpose of flattening the surface of the interlayer insulating film 51 and it is formed so as to be buried into only the concave of the stepped portion by the application, subsequent baking and further applying an etching treatment to the whole surface. The middle silicon oxide film 51B is removed by etching so as not to remain in the connection (connection hole 52) between the first wiring layer (50) and the second wiring layer (53). In other words, the silicon oxide film 50B as a middle layer is formed so as not to be exposed to the side wall of the connection hole 52 in order that the corrosion of the aluminum film of the wiring (each of 50 and 53) caused by the moisture contained in the film 50B can be diminished.

Over the word line 53 for shunt there is formed a passivation film 54 which is a silicon nitride film formed by a plasma CVD method and having a thickness of about 1 μm.

The CMOS which constitutes the peripheral circuitry of the DRAM 1 is formed as shown on the right-hand side of FIG. 1. The n-channel MISFET Qn of the CMOS is formed in the main surface portion of the p−-type well region 22 within the region surrounded by an insulating film 23 for element isolation and a p-type channel stopper region 24A. The n-channel MISFET Qn mainly comprises the p−-type well region 22, gate insulating film 25, gate electrode 26, a pair of n-type semiconductor regions 28 which are source and drain regions, and a pair of n+-type semiconductor regions 37.

The p−-type well region 22, gate insulating film 25, gate electrode 26 and n-type semiconductor regions 28 are formed by the same fabrication process and have substantially the same functions as in the foregoing memory cell selecting MISFET Qs. That is, the n-channel MISFET Qn is of LDD structure.

The n+-type semiconductor regions 37 of a high impurity concentration are constituted to reduce the resistance value of source region and that of drain region. The regions 37 are each formed while being defined by a side wall spacer 29 which has been formed by self-alignment along the side wall of the gate electrode 26, and each formed by self-alignment with respect to the gate electrode 26 and the side wall spacer 29.

To the n+-type semiconductor region 37 used as the source region is connected a wiring line 50 to which is applied the reference voltage Vss through a connection hole 40A formed in interlayer insulating films 31, 39 and 40, while to the n+-type semiconductor region 37 used as the drain region is connected a line 50 for output signal through the connection hole 40A formed in the interlayer insulating films 31, 39 and 40. The n+-type semiconductor regions 37 and the wiring lines 50 are electrically connected to each other through an n+-type semiconductor region 41 formed within the region defined by the connection hole 40A. The wiring line 50 is formed by the same electroconductive layer as that of the foregoing complementary data line 50.

The p-channel MISFET Qp of the CMOS is constituted in a main surface portion of an n−-type well region 21 in the region surrounded by an insulating film 23 for element isolation. The p-channel MISFET Qp mainly comprises the n−-type well region 21, gate insulating film 25, gate electrode 26, a pair of p-type semiconductor regions 30 which are source and drain regions, and a pair of p+-type semiconductor regions 38.

The n−-type well region 21, gate insulating film 25 and gate electrode 26 have substantially the same functions as in the memory cell selecting MISFET Qs and n-channel MISFET Qn.

The p-type semiconductor regions 30 of a low impurity concentration constitutes the p-channel MISFET Qp of LDD structure. To the p+-type semiconductor region 38 used as the source region is connected a wiring line 50 to which is applied the power-supply voltage Vcc through a connection hole 40A formed in interlayer insulating films 31, 39 and 40, while to the p+-type semiconductor region 38 used as the drain region is connected a wiring line 50 for output signal formed with the same layer as the foregoing complementary data line 50 through a connection hole 40A which is formed in the interlayer insulating films 31, 39 and 40. To this output signal line 50 is connected an overlying line 53 through a connection hole 52. The line 53 is formed by the same electroconductive layer as the foregoing word line 53 for shunt. On condition that the interlayer insulating film 31 by which the capacitance of the information storing capacitor C is increased, remained in peripheral circuit region, a connection hole 40A is formed in interlayer insulating films 31, 39, 40 so process margin for the connection hole 40A can be improved.

Thus, the wiring line 50 as the first metallic wiring layer is subjected to patterning while the interlayer insulating film 31 provided for increasing the capacitance of the information storing capacitor C in the memory cell array region is allowed to remain in the peripheral circuit region, so it is possible to form the wiring lines 50 in the memory cell array region and the lines 50 in the peripheral circuit region simultaneously with a high accuracy. This is because the interlayer insulating film 31 is allowed to remain in the peripheral circuit region and hence the difference in height below e first metallic wiring layer can be kept to a value not larger than 0.75 from a predetermined reference position even at the portions where the difference in height is the largest in both the memory cell array region and the peripheral circuit region.

The said portions where the difference in height is the largest are the portion where the word line 26, interlayer insulating film 31 and upper and lower electrode layers 35, 33 in the memory cell array region overlap one another and the portion present above the source or drain region in the peripheral circuit region.

In the DRAM 1 (semiconductor memory circuit device) of the present invention, the difference in the distance from the back of the semiconductor substrate 20 up to the first metallic wiring layer in both the memory cell array region and the peripheral circuit region can be kept within 1.5 μm, so the formation of the connection hole 40A in the interlayer insulating films 31, 39, 40 and that of the line 50 as the first metallic wiring layer can be done with a high accuracy. Consequently, it is possible to improve the integration density.

Further, since the difference in height between the memory cell array region and the peripheral circuit region can be reduced at the time of formation of the second metallic wiring layer, it is possible to effect the formation of the line 53 as the second metallic wiring layer on the first metallic wiring layer through the interlayer insulating film 51 also with a high accuracy.

Next, a concrete fabrication method for the DRAM 1 will be described below with reference to FIGS. 6 to 14.

There is first provided a p⁻-type semiconductor substrate 20 formed of a single crystal silicon, and there are formed a p⁻-type well region 22 and an n⁻-type well region 21, then gate electrodes 26 and interlayer insulating films 27 are formed on the surface of the p⁻-type semiconductor substrate 20. The processes up to this stage are described in detail in U.S. Ser. No. 497,537 filed Mar. 20, 1990, assigned to Hitachi, Ltd.

[Semiconductor Region Forming Process]

Figure 6:
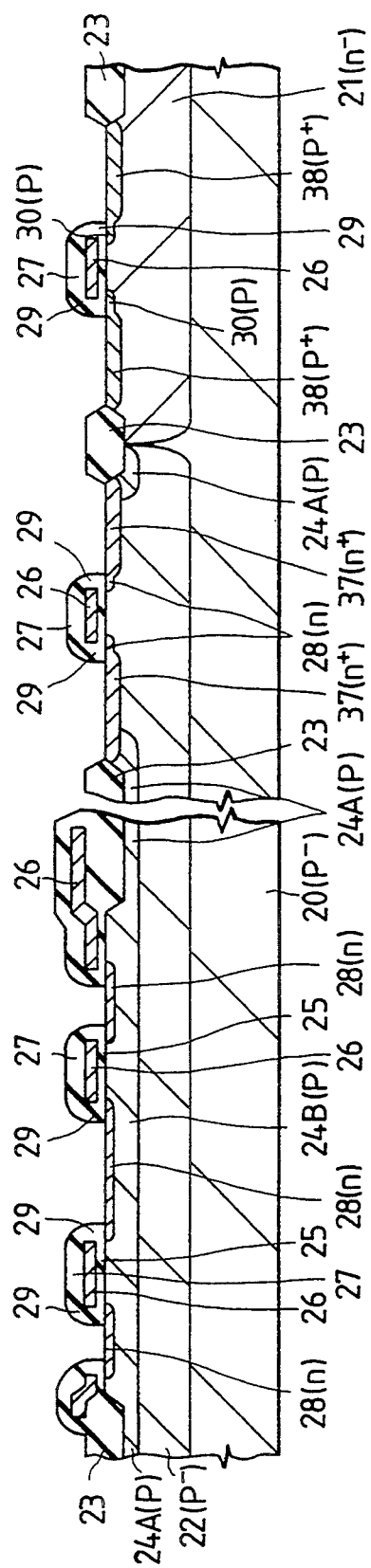
FIGS. 6 to 13 are sectional views of fabrication processes for the DRAM.

Then, in a memory cell array region and a peripheral circuit region, n-type semiconductor regions 28 of a low impurity concentration are formed in an n-channel MISFET Qn forming region, as shown in FIG. 6. More specifically, the n-type semiconductor regions 28 are formed by ion implantation of phosphorus at an impurity concentration of $10^{13}$ atoms/cm$^2$ or so using an energy of 80 to 120 KeV by self-alignment with respect to the gate electrodes 26.

Next, p-type semiconductor regions 30 of a low impurity concentration are formed in a p-channel MISFET Qp forming region in the peripheral circuit region. More specifically, the p-type semiconductor regions 30 are formed by ion implantation of BF$_2$ (or B) having an impurity concentration of $10^{13}$ atoms/cm$^2$ or so, using an energy of 60 to 100 KeV, by self-alignment with respect to the gate electrodes 26.

Then, side wall spacers 29 are formed on side walls of each of the gate electrodes 26, word lines 26 and the overlying interlayer insulating films. The side wall spacers 29 can be formed by deposition of a silicon oxide film followed by anisotropic etching such as RIE.

Next, n-type semiconductor regions 37 of a high impurity concentration are formed in the n-channel MISFET Qn forming region in the peripheral circuit region. More specifically, the n-type semiconductor regions 37 are formed by ion implantation of As having an impurity concentration of $10^{15}$ to $10^{16}$ atoms/cm$^2$, using an energy of 70 to 90 KeV, by self-alignment with respect to the gate electrodes 26 and the side wall spacers 29.

The n-type semiconductor regions 37 are not formed at both ends of the gate electrodes 26 (word lines 26) of the memory cell selecting MISFET Qs in the memory cell array region. The ion implantation for n-type semiconductor region 37 is done by using photo-resist mask covering the memory cell array region. This is because a crystal defect occurs on the surface oft he p⁻-type semiconductor substrate 20 in this ion implantation process and the leakage of electric charge results.

Then, p-type semiconductor regions 38 of a high impurity concentration are formed in the p-channel MISFET Qp forming region in the peripheral circuit region. More specifically, the p-type semiconductor regions 38 are formed by ion implantation of BF$_2$ having an impurity concentration of $10^{15}$ atoms/cm$^2$ or so, using an energy of 60 to 90 KeV, by self-alignment with respect to the gate electrodes 26 and the side wall spacers 29.

[Interlayer Insulating Film Forming Process]

Figure 7:
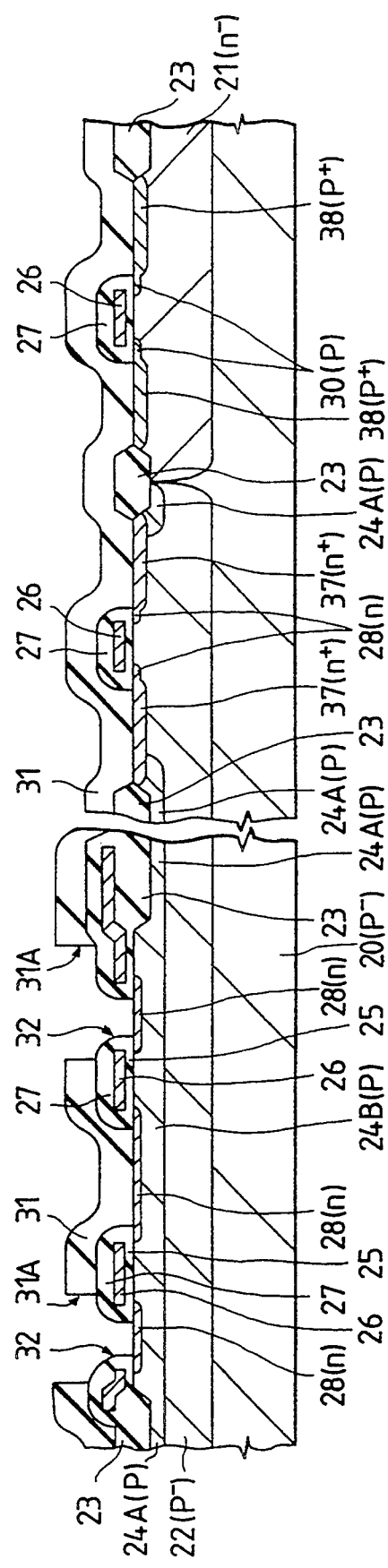

Next, as shown in FIG. 7, an interlayer insulating film 31 is formed throughout the whole surface of the substrate, including the upper surfaces of the interlayer insulating films 27 and side wall spacers 29, and connection holes 31A are formed in information storing capacitor C forming regions.

The interlayer insulating film 31 is a silicon oxide film or a silicon nitride film formed by CVD and having a thickness of about 500 nm. The film 31 is used as an etching stopper layer at the time of forming electrode layers of each information storing capacitor C of a stacked structure in the memory array region and the peripheral circuit region. It is also used for increasing the capacitance of the information storing capacitor C by utilizing the side faces of the interlayer insulating film 31 in the connection holes 31A.

[Information Storing Capacitor Forming Process]

Figure 8:
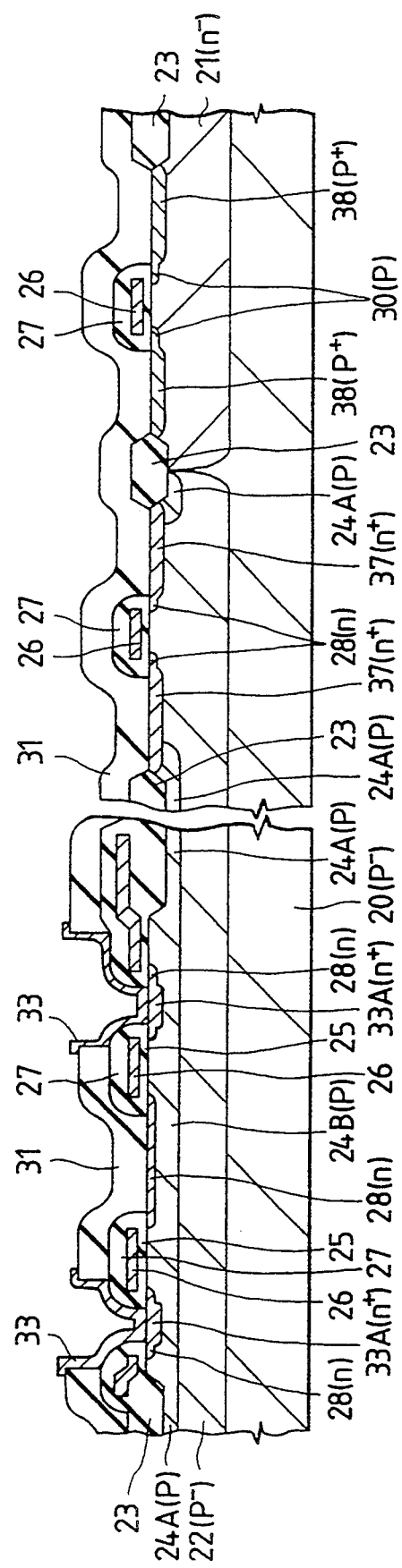

Next, as shown in FIG. 8, a lower electrode layer 33 of each information storing capacitor C is formed in each connection hole 31A formed in the interlayer insulating film 31. More specifically, the lower electrode layer 33 is formed by introducing an n-type impurity, e.g. P, into a polycrystalline silicon film deposited at a thickness of 100 nm, or so by CVD followed by the application of the photolithography or etching technique. The lower electrode layer 33 is patterned so that end portions thereof extend onto the interlayer insulating film 31.

In one of source and drain regions of the memory cell selecting MISFET Qs there is formed an n+-type semiconductor region 33A by diffusion of the n-type impurity from the lower electrode layer 33 through a connection hole 32 defined by the side wall spacers 29.

Figure 9:
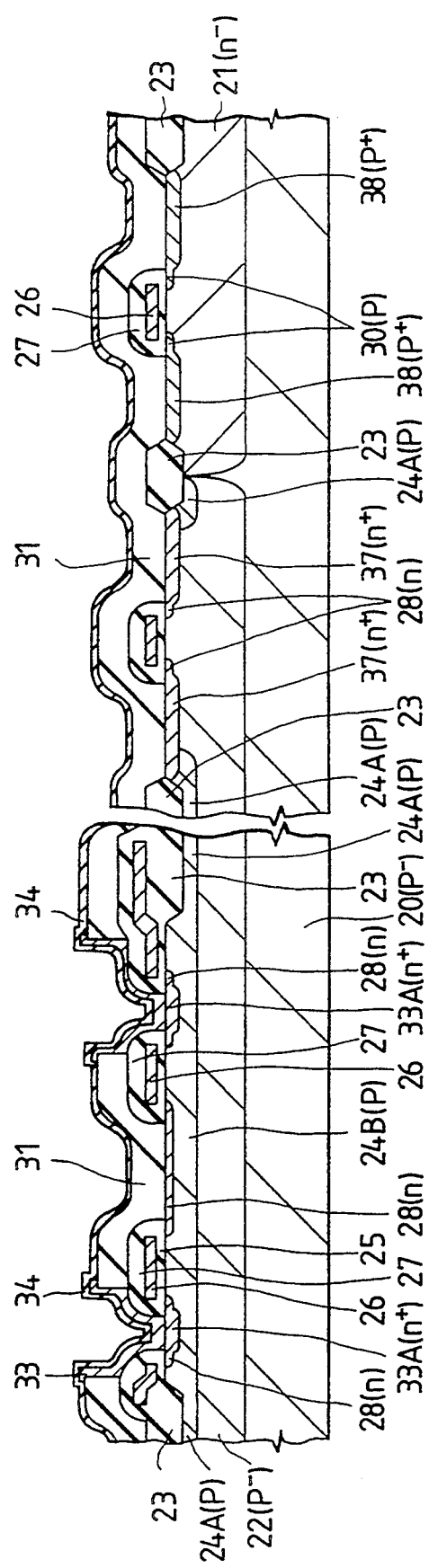

Then, as shown in FIG. 9, a dielectric film 34 is formed throughout the whole substrate surface, including the upper surfaces of the lower electrode layers 33 of the information storing capacitors C. The dielectric film 34 has a two-layer structure comprising a silicon nitride film and a silicon oxide film. The silicon nitride film is formed at a thickness of 5 to 10 nm by deposition according to a CVD method, while the silicon oxide film is formed at a thickness of 1 to 6 nm by placing the surface of the silicon nitride film in an oxygen atmosphere under the conditions of 1.5 to 10 atm. and 800° to 1,000° C. As a result, the thickness of the silicon nitride film becomes 4 to 8 nm.

Figure 10:
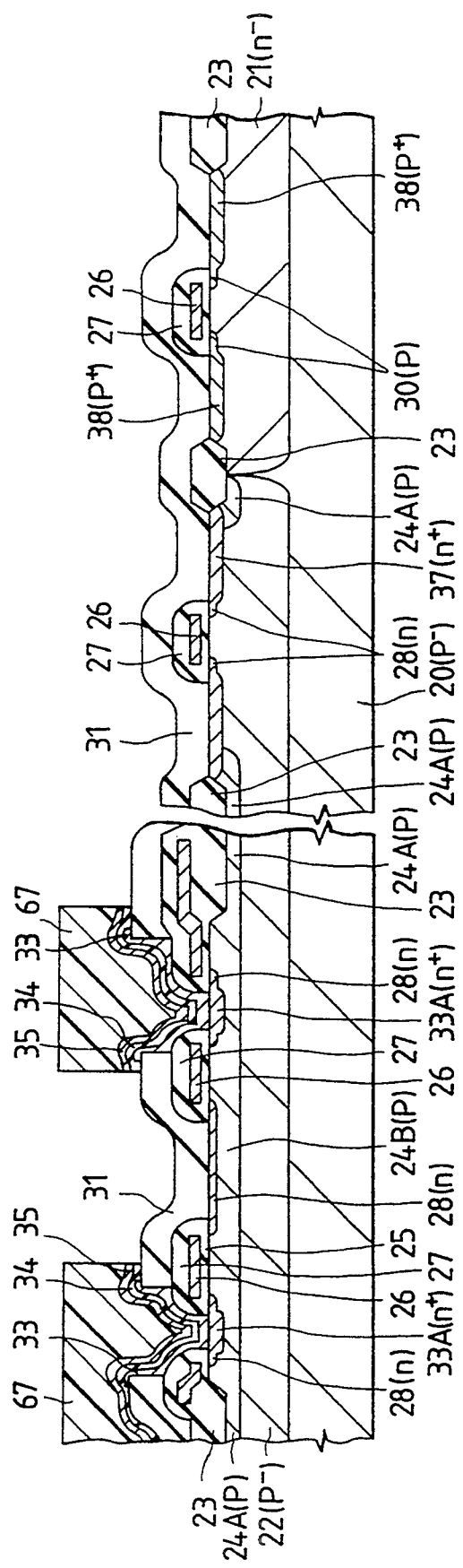

Next, as shown in FIG. 10, a polycrystalline silicon film is deposited throughout the whole substrate surface at a thickness of 100 nm or so by CVD. An n-type impurity, e.g. P, is introduced into this polycrystalline silicon film.

Then, an etching mask 67 is formed in the region forming an information storing capacitor. For example, the etching mask 67 is a photoresist film. Thereafter, using the etching mask 67, a polycrystalline silicon film which constitutes upper electrode layers 35, and the dielectric film 34, are etched successively.

[Interlayer Insulating Film Forming Process]

Figure 11:
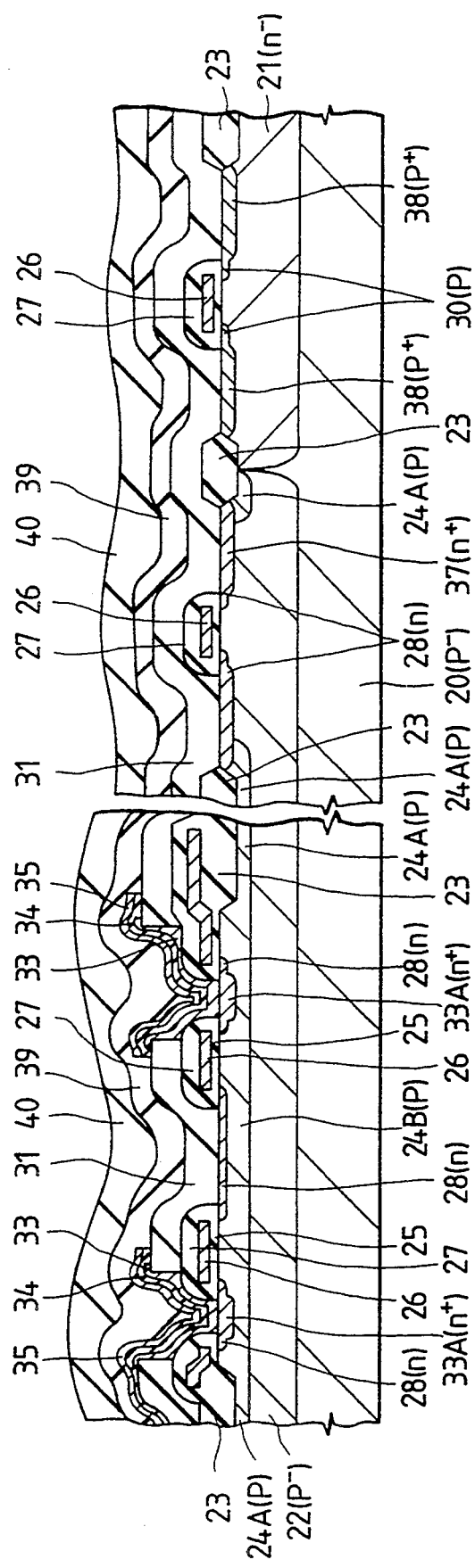

Next, as shown in FIG. 11, interlayer insulating films 39 and 40 are laminated successively onto the whole substrate surface, including the surfaces of the constituent elements of the DRAM 1. The interlayer insulating film 39 as a lower layer is a silicon oxide film deposited at a thickness of 200 nm or so by CVD, while the interlayer insulating film 40 as an upper layer is a silicon oxide film (BPSG film) deposited at a thickness of 500 nm or so by CVD and containing an impurity (P and B). The surface of the upper interlayer insulating film 40 is flattened by reflow in a nitrogen gas atmosphere at a temperature of about 900° to 1,000° C. The lower interlayer insulating film 39 prevents the entry of the impurity from the upper interlayer insulating film into the underlying MISFET portion.

[Connection Hole Forming Proces]

Figure 12:
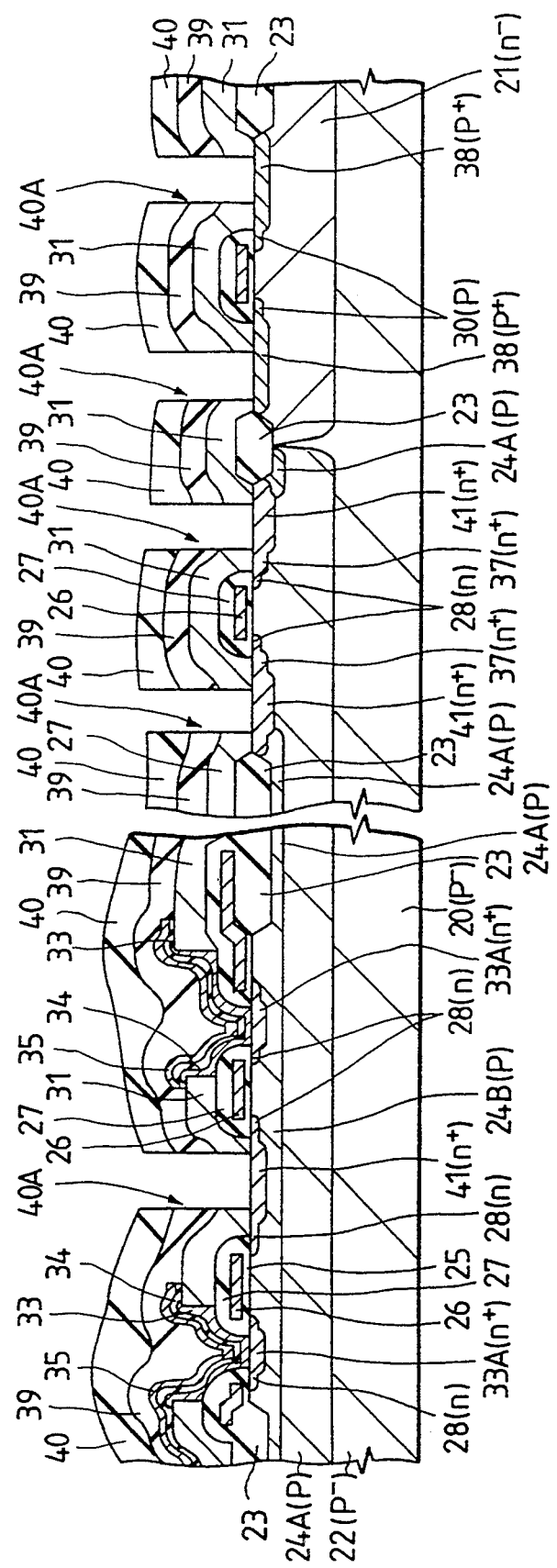

Next, as shown in FIG. 12, connection holes 40A are formed in the interlayer insulating films 39 and 40 by anisotropic etching.

Then, in the memory cell selecting MISFET Qs and the n-channel MISFET Qn which constitutes the peripheral circuitry, an n-type impurity is introduced into main surface portions of the n-type semiconductor regions 28 and n+-type semiconductor regions 37 through the connection holes 40A to thereby form n+-type semiconductor regions 41. More specifically, the n+-type semiconductor regions 41 are formed by ion implantation of As having an impurity concentration of $10^{15}$ atoms/cm$^2$, using an energy of 110 to 130 KeV. At this time, the p-channel MISFET Qp forming region is covered with a photoresist film for example.

Since the interlayer insulating film 31 is present also in the peripheral circuit region at the time of formation of the connection holes 40A, the difference in height between the memory cell array region and the peripheral circuit region is smaller than 1.5 μm in the exposure process for forming the connection holes 40A, therefore, both the memory cell array region and the peripheral circuit region can be placed simultaneously within the depth of focus of the aligner and so can be subjected to exposure at a time.

Further, since the difference in height between the memory cell array region and the peripheral circuit region is small, the processing accuracy for the connection holes 40A in the memory cell array region and that for the connection holes 40A in the peripheral circuit region can be made substantially the same, so it is possible to take a large processing margin.

[Wiring Process]

Figure 13:
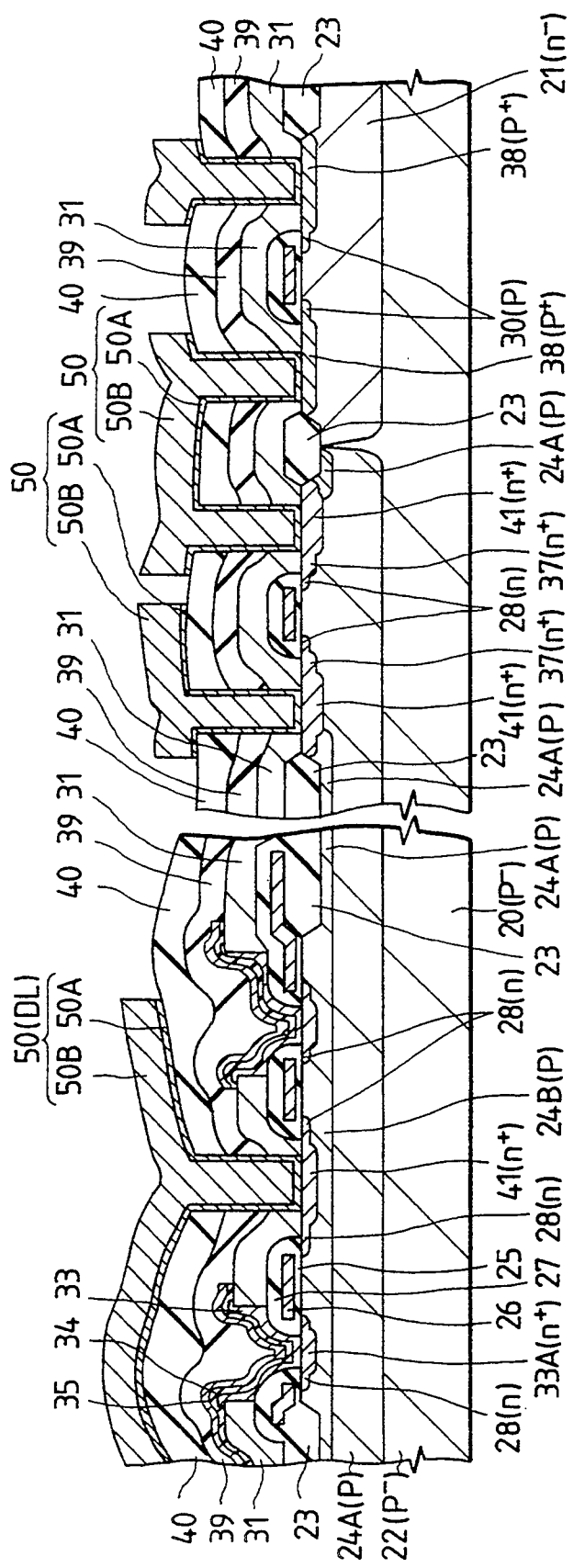

Next, as shown in FIG. 13, there are formed wiring lines 50 as first metallic wiring layers in contact with the n+-type semiconductor regions and the p+-type semiconductor regions 38 and extending onto the interlayer insulating film 40. The wiring lines 50 are each a laminate film of TiN and W and are used as complementary data lines (DL) 50 in the memory cell array region. The TiN film is formed at a thickness of about 100 nm by sputtering, and the W film is formed at a thickness of about 500 nm also by sputtering. Both photolithography technique and etching technique are used for the formation of the wiring lines 50.

Since the interlayer insulating film 31 is present in the peripheral circuit region, the difference in height between the memory cell array region and the peripheral circuit region at the time of patterning of the wiring lines 50 is smaller than 1.5 μm. In the exposure process for patterning of the wiring lines 50, therefore, both the memory cell array region and the peripheral circuit region can be placed simultaneously within the depth of focus of the aligner and so can be subjected to exposure at a time.

Moreover, since the processing accuracy for the wiring lines 50 in the memory cell array region and that in the peripheral circuit region can be made substantially the same, it is possible to take a large processing margin.

Further, since the difference in height between the memory cell array region and the peripheral circuit region is small, it is possible to prevent the breakage at a stepped portion of the lines 50, e.g. data lines, extending from the memory cell array region continuously to the peripheral circuit region.

Thereafter, as shown in FIG. 1, an interlayer insulating film 51, a line 53 as the second metallic wiring layer, and a passivation film 54, are formed to complete the semiconductor memory circuit device of this embodiment.

Embodiment II

Figure 14:
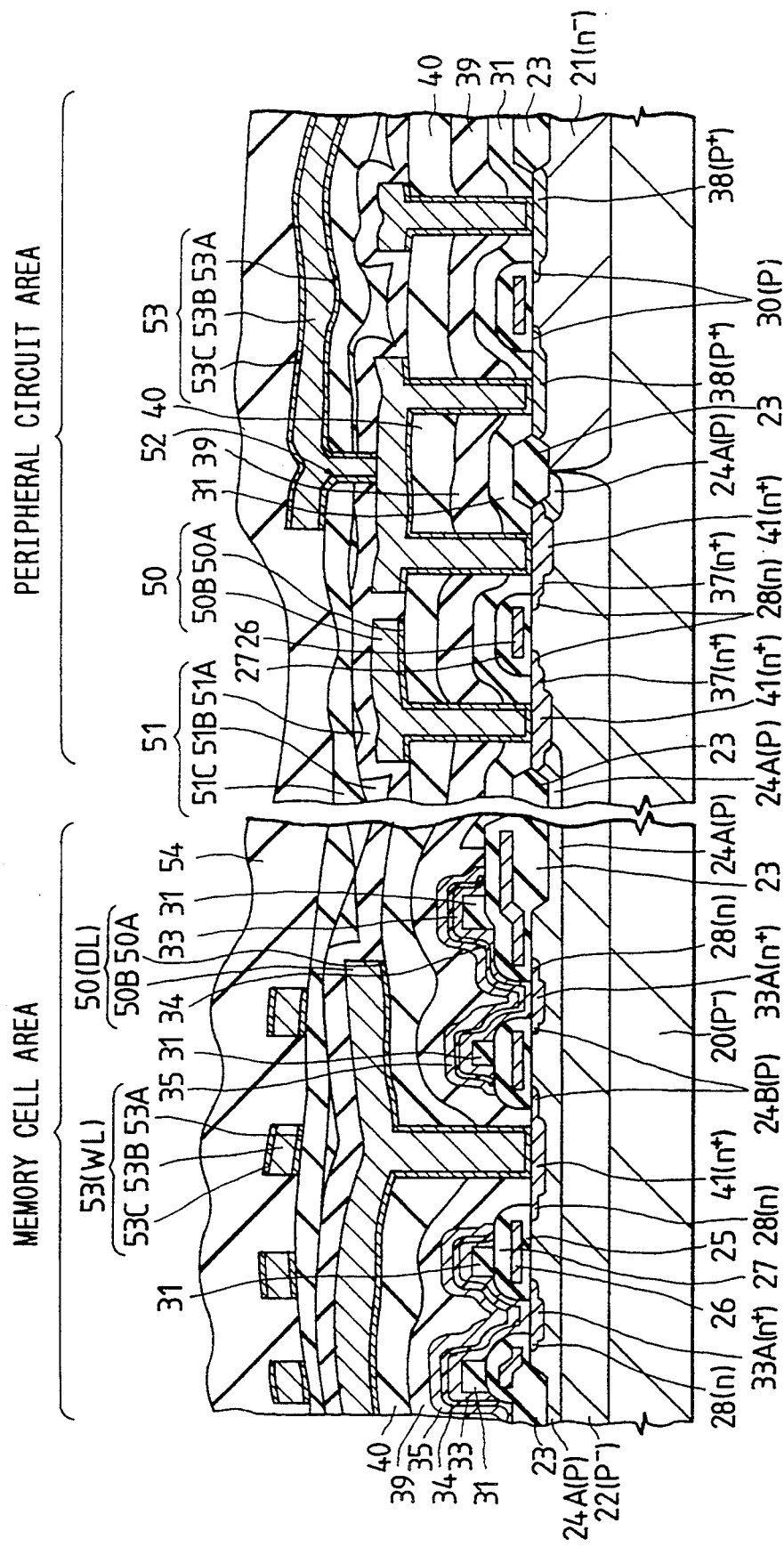
FIG. 14 is a sectional view of a principal portion of a DRAM according to another embodiment II of the present invention.

According to another embodiment II of the present invention, as shown in FIG. 14, the capacitance of the information storing capacitor C in each memory array in the DRAM of embodiment I can be increased.

This embodiment II is different from the previous embodiment I in the shape of the interlayer insulating film 31 provided in the memory cell array region. In the embodiment I, as shown in FIG. 7, the connection hole 31A is formed only in the source or drain region of the memory cell selecting MISFET Qs to which the information storing capacitor C is connected. On the other hand, in this embodiment II, an interlayer insulating film 31 is allowed to remain in the form of a ring so as to surround the source or drain region of the memory cell selecting MISFET Qs to which the information storing capacitor C is connected.

The lower and upper electrode layers 33 and 35 of the information storing capacitor C are formed so as to cover both side walls of the ring-like interlayer insulating film 31.

Thus, in the memory cell of this embodiment, since the information storing capacitor C is formed along both side walls of the interlayer insulating film 31, it is possible to reduce the occupied area thereof and realize a large capacitance.

Also in the memory cell of such a structure, the same effect as in the embodiment I can be obtained by allowing the interlayer insulating film 31 to remain in the peripheral circuit region.

The materials and film thicknesses of the constituent layers of DRAM 1 according to this embodiment, as well as how to produce them, are the same as in the embodiment I.

Both embodiments I and II are examples of memory cells of the type which utilizes the side walls of the interlayer insulating film 31 for enlarging the capacitance value of the information storing capacitor C.

As another memory cell of a stacked structure there is a memory cell of the type in which the lower electrode layer 33 is extended vertically upwards to increase the capacitance. The following is a further embodiment of the present invention applied to such a type of a memory cell.

Embodiment III

Figure 15:
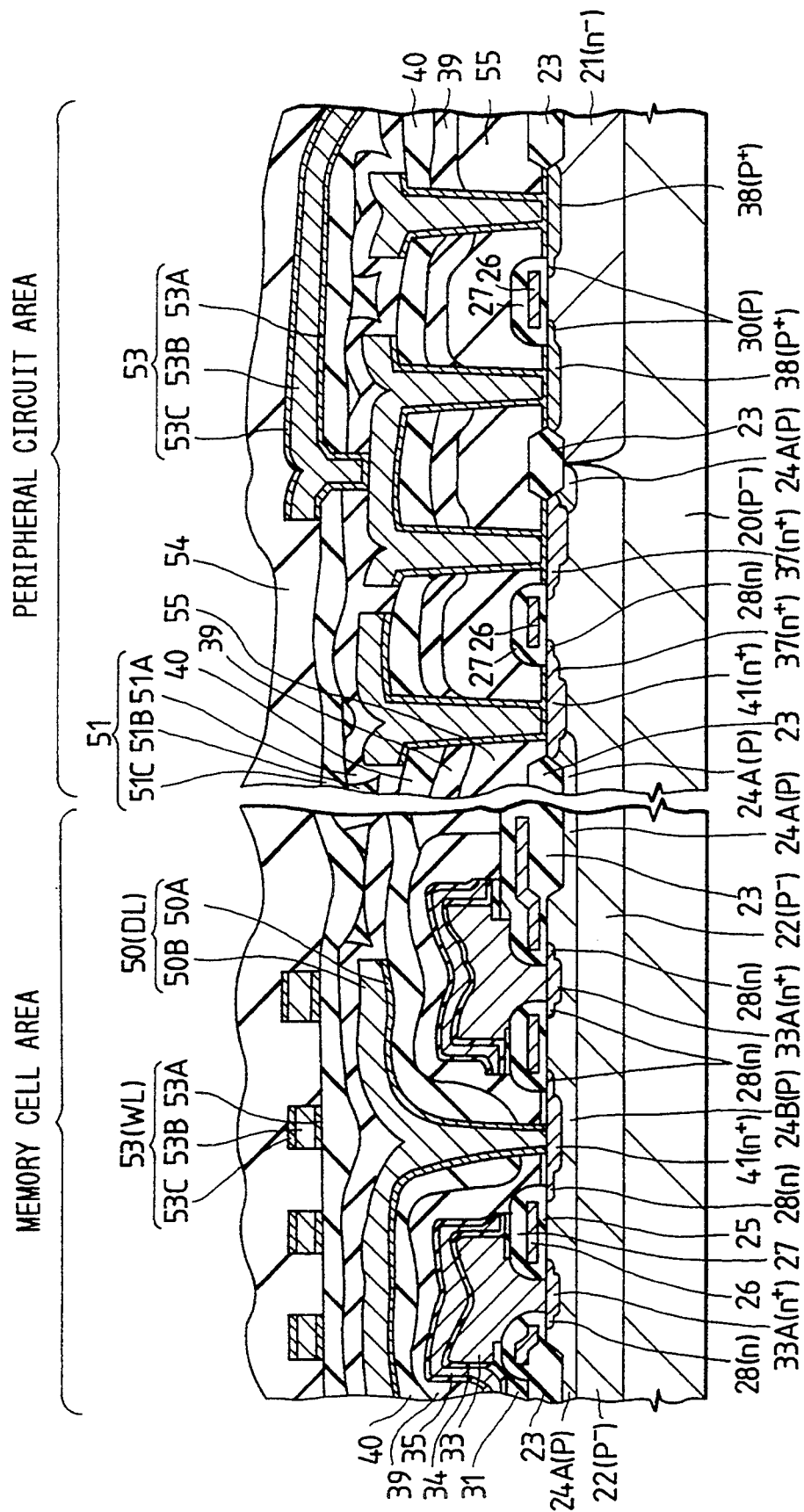
FIG. 15 is a sectional view of a principal portion of a DRAM according to a further embodiment III of the present invention.

In a DRAM according to this embodiment III, as shown in FIG. 15, an interlayer insulating film is thin and instead a lower electrode layer 33 is formed thick in comparison with the DRAM of embodiment I. Further, an interlayer insulating film 55 for diminishing the difference in height between the memory cell array region and the peripheral circuit region is provided in only the peripheral circuit region.

In a memory cell of the type wherein the lower electrode layer 33 is extended vertically upwards to increase the capacitance, allowing the interlayer insulating film 31 to remain in the peripheral circuit region does not directly lead to reducing the difference in height between the memory cell array region and the peripheral circuit region.

Therefore, the interlayer insulating film 55 for diminishing the difference in height is provided in only the peripheral circuit region. The thickness of this interlayer insulating film 55 corresponds to the sum of the thicknesses of the lower electrode layer 33, dielectric film 34 and upper electrode layer 35 of the information storing capacitor C.

The following description is now provided about the portion of the DRAM 1 illustrated in FIG. 15 which portion is different from the DRAM of embodiment I shown in FIG. 1.

In this embodiment III, the thickness of the interlayer insulating 31 is 100 nm, that of the lower electrode layer 33 is 500 nm and that of the interlayer insulating film 55 is 500 nm.

The interlayer insulating film 55 may be provided between or over interlayer insulating films 39 and 40 if only it is located below the wiring line 50 as the first metallic wiring layer.

Now, how to fabricate the DRAM 1 of this embodiment III will be described below with reference to FIGS. 16 to 20.

[Semiconductor Region Forming Proces]

Figure 16:
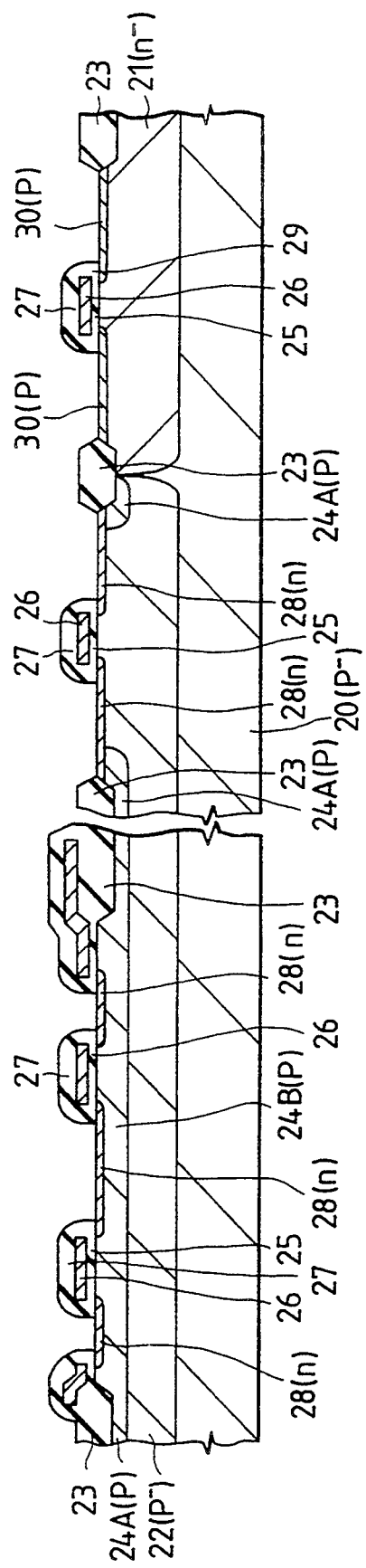
FIGS. 16 to 20 are sectional views showing fabrication processes for the DRAM of the embodiment III.

As shown in FIG. 16, in the memory cell array region and the peripheral circuit region, n-type semiconductor regions 28 of a low impurity concentration are formed in an n-channel MISFET Qn forming region, while p-type semiconductor regions 30 of a low impurity concentration are formed in a p-channel MISFET Qp forming region in the peripheral circuit region. This process corresponds to the process shown in FIG. 6 in embodiment I. How to form the n- and p-type semiconductor regions 28 and 30 is the same as in embodiment I.

In this embodiment III, n+-type semiconductor regions 37 and p+-type semiconductor regions 38 are not formed yet at this stage in the peripheral circuit region.

[Interlayer Insulating Film Forming Process)

Figure 17:
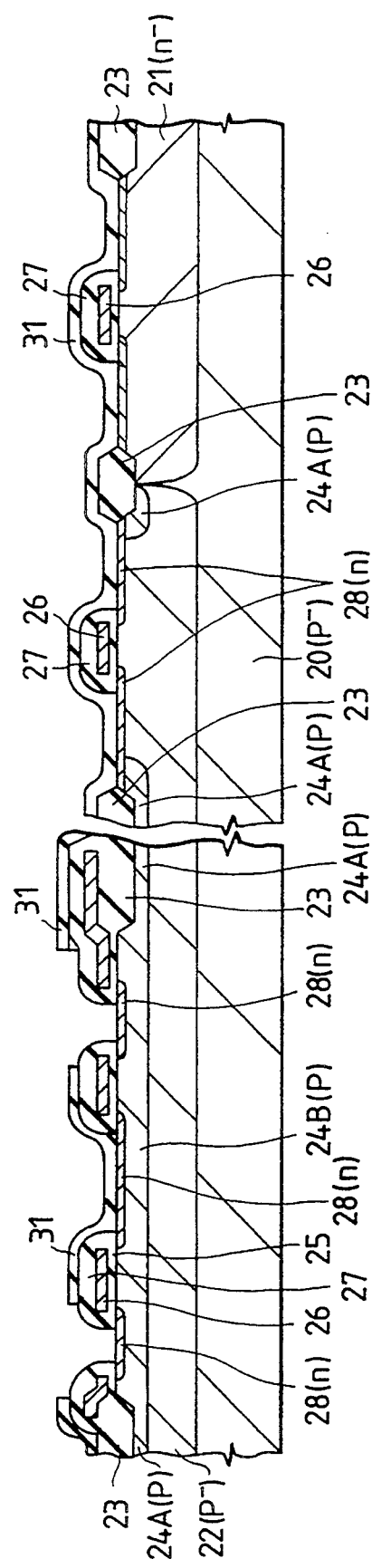

Next, as shown in FIG. 17, interlayer insulating films 31 are formed in the same manner as in FIG. 7, provided the thickness thereof is 100 nm, thinner than that in embodiment I.

[Information Storing Capacitor Forming Process]

Figure 18:
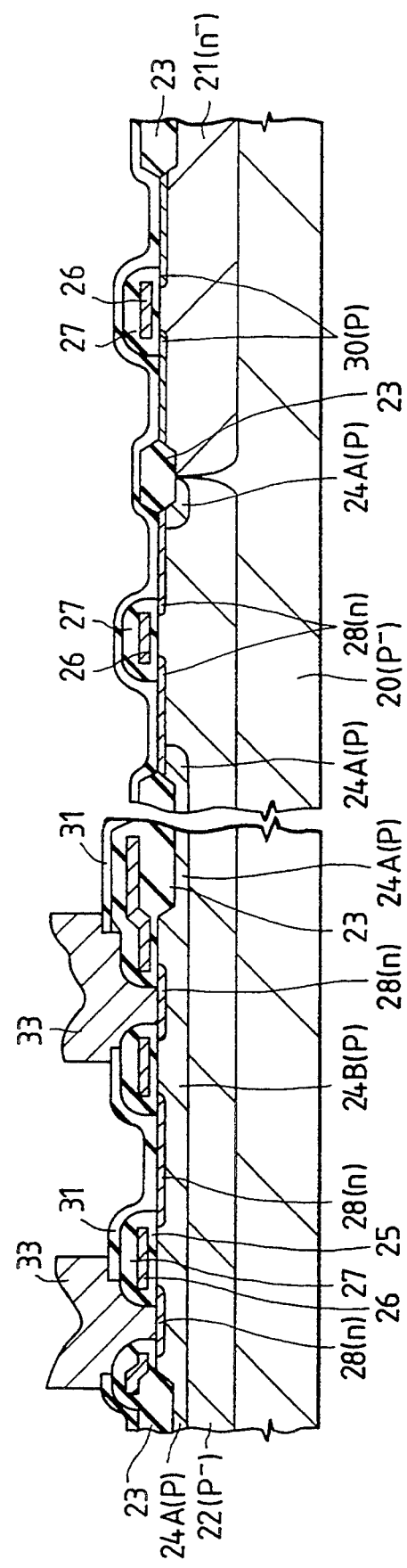
Figure 19:
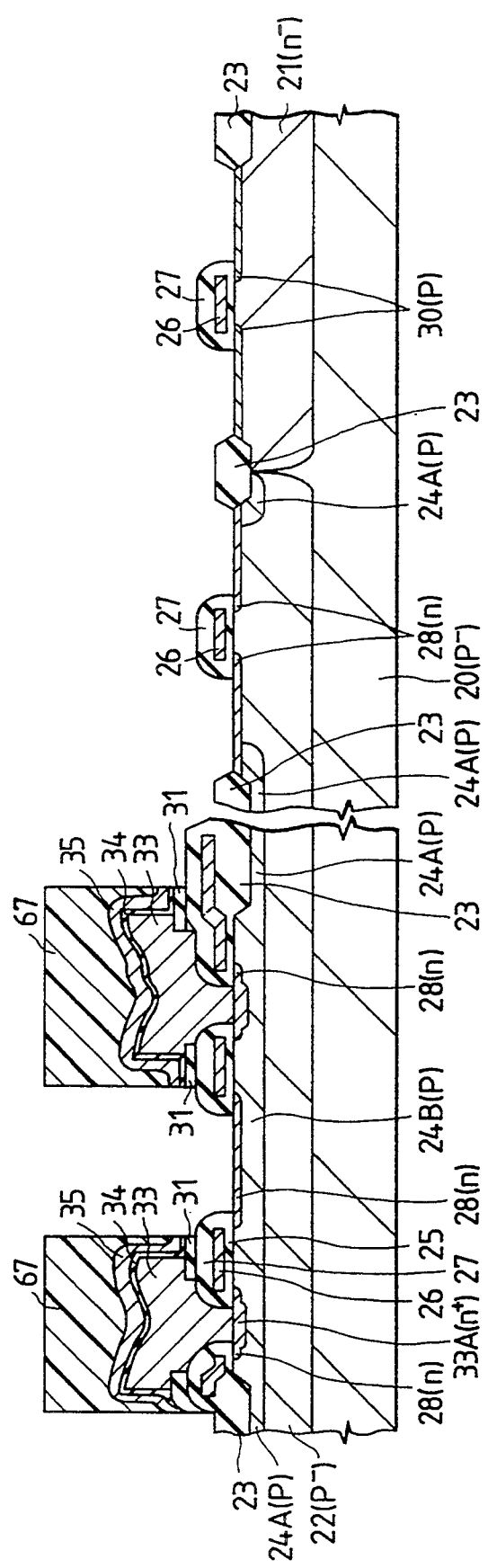

Next, a lower electrode layer 33, a dielectric film 34 and an upper electrode layer 35 of each information storing capacitor C are formed successively, as shown in FIGS. 18 and 19. These are formed in the same manner as in embodiment I, provided the thickness of the lower electrode layer 33 is 500 nm. Further, although in the process of FIG. 10 described in embodiment I the polycrystalline silicon film which constitutes the upper electrode layer 35 and the dielectric film 34 are etched successively using the etching mask 67, the interlayer insulating films 31 are also etched in this embodiment III.

[Semiconductor Region Forming Process]

Next, in the peripheral circuit region, n+- and p+-semiconductor regions are formed in the n- and p-channel MISFETs Qn and Qp. How to form them is as already explained in connection with the process of FIG. 6 in embodiment I.

[Interlayer Insulating Film Forming Process]

Figure 20:
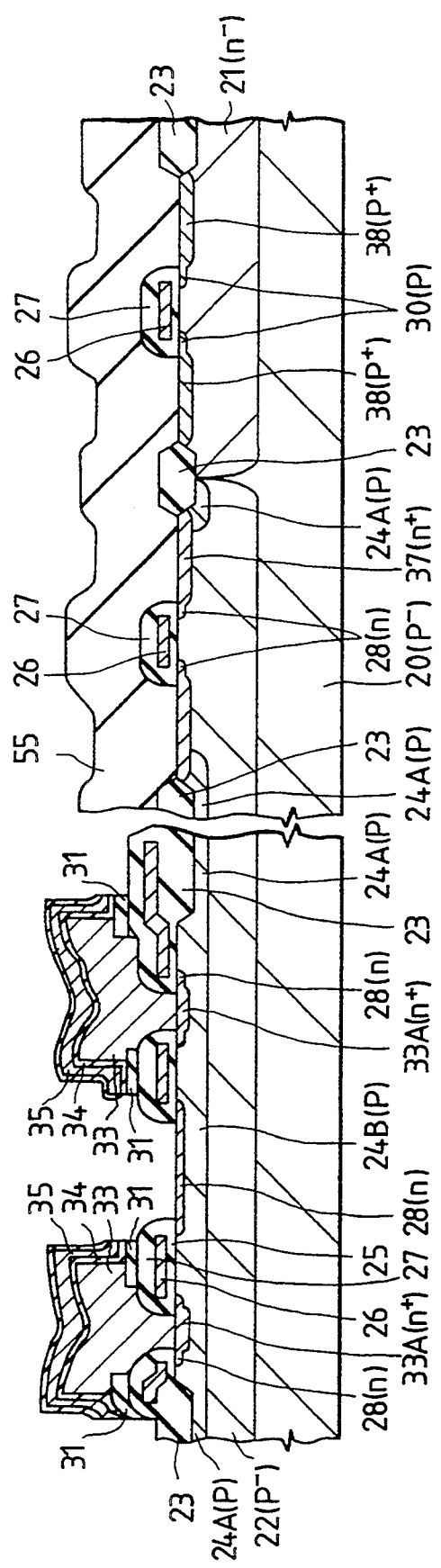

Then, as shown in FIG. 20, an interlayer insulating film 55 is formed in only the peripheral circuit region. The interlayer insulating film 55 is a silicon oxide film or a silicon nitride film formed by CVD, having a thickness almost equal to the sum of the thicknesses of the lower electrode layer, dielectric film and upper electrode layer of the information storing capacitor C. In this embodiment, the thickness of the interlayer insulating film 55 is 600 nm.

By providing the interlayer insulating film 55 in the peripheral circuit region it is made possible to diminish the difference in height between the memory cell array region and the peripheral circuit region.

Thereafter, as shown in FIG. 15, interlayer insulating films 39, 40 line 50 as the first metallic wiring layer, interlayer insulating film 51, line 53 as the second metallic wiring layer, and passivation film 54, are formed successively to complete the DRAM 1 of this embodiment III. In this embodiment, the interlayer insulating film 55 may be formed between or after the interlayer insulating films 39 and 40.

The interlayer insulating film 55 may be formed before the formation of the lower electrode layer 33 of the information storing capacitor C and in this case it is not necessary to form the interlayer insulating film 31.

The n+-type semiconductor regions 37 and p+-type semiconductor regions 38 must be formed before the formation of the interlayer insulating films 39, 40 and 55.

In the embodiments I to III, the difference in height between the memory cell array region and the peripheral circuit region means the difference in height before the formation of the first metallic wiring layer which overlies the information storing capacitor C, that is, after the formation of the interlayer insulating film 40.

The peripheral circuit region means the other region than the memory cell array region, including a bonding pad BP forming region in addition to direct and indirect peripheral circuits.

Although the present invention has been described above concretely in terms of embodiments of the invention, it is to be understood that the present invention is not limited to those embodiments and that various modifications may be made within the scope not departing from the gist of the invention. For example, the present invention is applicable to a microcomputer which incorporates a DRAM therein, or a SRAM.

The following is a brief explanation of the effects obtained by typical inventions out of those disclosed herein.

(1) It is possible to improve the integration density of the semiconductor memory circuit device.
(2) It is possible to improve the product yield of the semiconductor memory circuit device.
(3) It is possible to improve the electrical reliability of the semiconductor memory circuit device.
(4) It is possible to shorten the fabrication process for the semiconductor memory circuit device.

What is claimed is:

1. A method for fabricating a semiconductor memory circuit device having an array of memory cells arranged in a matrix form, each memory cell containing a first MISFET and an information storing capacitor connected in series with each other, and also having peripheral circuitry constituted by a plurality of second MISFETs, said method comprising:

(a) a step of forming a first gate electrode of each first MISFET and a second gate electrode of each second MISFET in first and second regions, respectively, on a semiconductor substrate;

(b) after forming the first and second gate electrode, a step of introducing first impurities of N conductivity type into said semiconductor substrate in self-alignment with respect to said first and second gate electrodes in said first and second regions, so as to form a source region and a drain region for said first and second MISFETs;

(c) after introducing the first impurities of N conductivity type, a step of forming a third insulating film in both said first and second regions on said semiconductor substrate;

(d) a step of removing a portion of the third insulating film so as to expose one of the source and drain regions of said first MISFET;

(e) a step of forming a first electrode of said information storing capacitor so as to be in contact with said one of the source and drain regions of said first MISFET exposed through said third insulating film;

(f) a step of forming in sequence, a dielectric film and a second electrode of said information storing capacitor on said first electrode;

(g) a step of forming a second insulating film on said third insulating film in the first and second regions of said semiconductor substrate, after performing steps (e) and (f); and (h) a step of forming a wiring layer on said second insulating film in said first and second regions, wherein said first and second electrodes extend on said third insulating film in said first region and the thickness of said third insulating film is larger than a total thickness of said first and second electrodes of said information storing capacitor.

2. A method for fabricating a semiconductor memory circuit device according to claim 1, wherein, in step (d), a portion of the third insulating film overlying said first gate electrode is removed.

3. A method for fabricating a semiconductor memory circuit device according to claim 2, wherein, in step (e), an edge of said first electrode is patterned on said third insulating film.

4. A method for fabricating a semiconductor memory circuit device according to claim 1, including the additional step, between steps (g) and (h), of forming holes in said second insulating film so as to expose the other of the source and drain regions of said first MISFET.

5. A method for fabricating a semiconductor memory circuit device according to claim 4, wherein, in the step of forming holes, further holes are formed in said second and third insulating films so as to expose said source and drain regions of said second MISFET.

6. A method for fabricating a semiconductor memory circuit device according to claim 5, further including the steps of forming a fourth insulating film over said wiring layer and forming a further wiring layer over said fourth insulating film.

7. A method for fabricating a semiconductor memory circuit device according to claim 1, wherein the step of forming the second insulating film includes substeps of forming a silicon oxide film and of forming a boro-phospho-silicate glass film on said silicon oxide film.

8. A method for fabricating a semiconductor memory circuit device according to claim 7, further comprising the step of performing an annealing of said boro-phospho-silicate glass film.

9. A method for fabricating a semiconductor memory circuit device according to claim 1, wherein a side face of said third insulating film forms a boundary of said portion of said third insulating film, wherein a portion of said first electrode extends on said side face, and wherein said dielectric film and said second electrode extend on the portion of the first electrode extending on said side face.

10. A method for fabricating a semiconductor memory circuit device according to claim 9, wherein a further portion of the first electrode extends onto an upper surface of the third insulating film, and wherein the dielectric film and the second electrode extend on the further portion of the first electrode that extends onto the upper surface of the third insulating film.

11. A method for fabricating a semiconductor memory circuit device according to claim 1, wherein steps (e) and (f) are performed by forming layers of material of the first electrode, of material of the dielectric film and of material of the second electrode, and removing portions of said layers to form said first electrode, said dielectric film and said second electrode.

12. A method for fabricating a semiconductor memory circuit device according to claim 11, wherein said portions of said layers are removed by etching, the third insulating film acting as an etching stopper for said etching.

13. A method for fabricating a semiconductor memory circuit device according to claim 1, wherein the portion of the third insulating film is removed, in the first region, so as to form a remainder of the third insulating film, in the first region, in the shape of a ring, surrounding said one of the source and drain regions of said first MISFET and exposing said one of the source and drain regions of said first MISFET.

14. A method for fabricating a semiconductor memory circuit device according to claim 13, wherein said ring of the remainder of the third insulating film has first and second side surfaces and an upper surface, and the first electrode is formed such that portions thereof cover the first and second side surfaces and the upper surface.

15. A method for fabricating a semiconductor memory circuit device according to claim 14, wherein said dielectric film and said second electrode cover the portions of the first electrode covering the first and second side surfaces and the upper surface.

16. A method of fabricating a semiconductor memory circuit device according to claim 1, wherein, in step (d), said portion of the third insulating film is removed without removing third insulating film on the second region.

17. A method of fabricating a semiconductor memory circuit device according to claim 1, wherein the second insulating film is formed on the third insulating film in the second region, without having removed third insulating film on the second region.

18. A method of fabricating a semiconductor memory circuit device according to claim 1, wherein said wiring layer is formed in step (h) so as to cover said second electrode of said information storing capacitor in said first region and said second gate electrode in said second region.

19. A method of fabricating a semiconductor memory circuit device according to claim 1, further comprising, between steps (b) and (c):

(i) a step of forming a fifth insulating film on said semiconductor substrate, overlying the first and second gate electrodes;

(j) a step of performing a reactive ion etching of said fifth insulating film so as to form side wall insulating films along end portions of the first and second gate electrodes; and (k) a step of introducing second impurities of N conductivity type into said semiconductor substrate in self-alignment with respect to said second gate electrode and said side wall insulating film.

20. A method of fabricating a semiconductor memory circuit device according to claim 4, wherein, in the step of forming holes, further holes are formed in the third insulating film so as to expose the other of the source and drain regions of said first MISFET, and wherein said step of forming the wiring layer includes forming the wiring layer in the holes in the second and third insulating films exposing the other of the source and drain regions of said first MISFET, such that the wiring layer is in electrical contact with the other of the source and drain regions of said first MISFET.

* * * * *